United States Patent [19]
Yokoya et al.

[11] Patent Number: 5,397,676
[45] Date of Patent: Mar. 14, 1995

[54] IMAGE FORMING METHOD INCLUDING HEAT DEVELOPMENT WHILE COVERING SURFACE OF LIGHT-SENSITIVE MATERIAL

[75] Inventors: Hiroaki Yokoya; Osami Tanabe, both of Shizuoka, Japan

[73] Assignee: Fuji Photo Film Co., Ltd., Kanagawa, Japan

[21] Appl. No.: 194,327

[22] Filed: Feb. 8, 1994

[30] Foreign Application Priority Data

Feb. 8, 1993 [JP] Japan ................................ 5-044583
Mar. 18, 1993 [JP] Japan ................................ 5-083983

[51] Int. Cl.$^6$ .................... G03C 5/54; G03F 3/10; G03F 7/26
[52] U.S. Cl. .................... 430/203; 430/258; 430/260; 430/273; 430/291; 430/293; 430/330
[58] Field of Search .............. 430/203, 258, 260, 273, 430/330

[56] References Cited
U.S. PATENT DOCUMENTS

| | | | |
|---|---|---|---|
| 4,631,246 | 12/1986 | Bennett | 430/260 |
| 4,945,025 | 7/1990 | Nakamura | 430/138 |
| 5,122,443 | 6/1992 | Takeda | 430/203 |
| 5,290,659 | 3/1994 | Takeda | 430/203 |
| 5,304,454 | 4/1994 | Yokoya et al. | 430/255 |

*Primary Examiner*—Richard L. Schilling
*Attorney, Agent, or Firm*—Birch, Stewart, Kolasch & Birch

[57] ABSTRACT

The present invention provides a new image forming method. The image forming method uses a light-sensitive material. The light-sensitive material comprises a support and a light-sensitive polymerizable layer. The light-sensitive polymerizable layer contains silver halide, a reducing agent and an ethylenically unsaturated polymerizable compound or a cross-linkable polymer. Any of the silver halide, the reducing agent, the polymerizable compound and the polymer are not encapsulated in the layer. The image forming method comprising the steps of imagewise exposing to light the light-sensitive material and simultaneously or thereafter heating the light-sensitive material at a temperature of not lower than 70° C. At the heat development, the silver halide is developed and the polymerizable compound or the cross-linkable polymer is hardened. Thus, a hardened image is formed on the light-sensitive material. The heat development is conducted while covering a surface of the light-sensitive polymerizable layer with a sheet or a heating means. According to the present invention, a space of 0.5 to 500 $\mu m$ intervenes between the surface of the light-sensitive polymerizable layer and the surface of the sheet or the heating means.

27 Claims, 5 Drawing Sheets

IMAGE FORMING METHOD INCLUDING HEAT DEVELOPMENT WHILE COVERING SURFACE OF LIGHT-SENSITIVE MATERIAL

FIELD OF THE INVENTION

The present invention relates to an image forming method comprising the steps of imagewise exposing to light a light-sensitive material, and simultaneously or thereafter heating the light-sensitive material to form a hardened image on the light-sensitive material.

BACKGROUND OF THE INVENTION

U.S. Pat. No. 4,629,676 (Hayakawa et al) and European Patent Publication No. 0174634B1 disclose an image forming method comprising the steps of imagewise exposing to light a light-sensitive material that comprises a support and a light-sensitive layer containing silver halide, a reducing agent and a polymerizable compound, and simultaneously or thereafter heating the light-sensitive material to develop the silver halide and harden the polymerizable compound. The silver halide, the reducing agent and the polymerizable compound are preferably contained in microcapsules that are dispersed in the light-sensitive polymerizable layer. According to the method, a hardened image is easily formed on the light-sensitive material by the heat development. Further, the sensitivity of the light-sensitive material is very high because silver halide is used as a photosensor.

The heat development is convenient and advantageous compared with a wet development using a developing solution. However it is rather difficult to control the conditions of the heat development (e.g., temperature, time and heating means). For example, the hardness of the obtained image is sometimes insufficient when the light-sensitive material is heated while the surface of the light-sensitive layer is open to the air. Oxygen in the air has a function of inhibiting a polymerization reaction. The most convenient way of preventing the influence of oxygen is to heat the light-sensitive material while pressing the surface of the light-sensitive layer on the surface of a heating means.

U.S. Pat. No. 4,945,025 (Nakamura) discloses a light-sensitive material having a cover sheet. The sheet covers the surface of the light-sensitive layer to prevent the influence of oxygen.

By the way, the above-mentioned image forming method is available for forming a lithographic plate or a color proof.

U.S. Pat. No. 5,122,443 (Takeda) and European Patent Publication No. 0426192B1 disclose a method of forming a lithographic plate. Further, U.S. patent application Ser. No. 07/878,996, which is now U.S. Pat. No. 5,304,454, and German Patent Publication No. 4215035A1 disclose a method of forming a color proof. In the method of forming a lithographic plate or a color proof, a cross-linkable polymer may be used in place of or in combination with the polymerizable compound. Further, the polymerizable compound or the cross-linkable polymer is uniformly contained in the layer without use of microcapsules.

SUMMARY OF THE INVENTION

The present inventors have studied the method of forming a lithographic plate or a color proof without use of microcapsules. In the method of forming a lithographic plate or a color proof as well as the method using microcapsules, oxygen in the air has a function of inhibiting a hardening reaction.

However, the inventors have found that the previous techniques of preventing the influence of oxygen cannot be applied to the method of forming a lithographic plate or a color proof. After the heat development is conducted while covering the surface of the light-sensitive polymerizable layer with a surface of a cover sheet or a heating means, the inventors note unevenness on the obtained image (e.g., unevenness of development, partial fog, partially insufficient hardness).

Further, the light-sensitive polymerizable layer uniformly containing the polymerizable compound or the cross-linkable polymer tends to adhere to the sheet or the heating means while heating. The surface layer of the light-sensitive material usually contains a thermoplastic resin (e.g., polyvinyl alcohol) as a binder. If the surface layer adheres to the sheet or the heating means, the layer would be partially broken, and the sheet or the heating means would be contaminated with broken pieces of the layer. Therefore, it is difficult to reuse the sheet or the heating means.

An object of the present invention is to provide an image forming method wherein the developing reaction of silver halide and the hardening reaction of the polymerizable compound or the cross-linkable polymer smoothly and uniformly proceed in the heated light-sensitive material.

Another object of the invention is to provide an image forming method including a heat development wherein the surface of the light-sensitive polymerizable layer does not adhere to a cover sheet or a heating means.

The present invention provides an image forming method comprises the following three embodiments.

The first embodiment of the present invention is an image forming method comprising the steps of:

imagewise exposing to light a light-sensitive material which comprises a support and a light-sensitive polymerizable layer containing silver halide, a reducing agent and an ethylenically unsaturated polymerizable compound or a cross-linkable polymer, any of said silver halide, said reducing agent, said polymerizable compound and said polymer not being encapsulated in the layer; and simultaneously or thereafter heating the light-sensitive material at a temperature of not lower than 70° C. to develop the silver halide and harden the ethylenically unsaturated polymerizable compound or the cross-linkable polymer, whereby a hardened image is formed on the light-sensitive material, wherein the heat development is conducted by heating the light-sensitive material from side of the support under conditions that a surface of the light-sensitive polymerizable layer is covered with a cover sheet and that a space of 0.5 to 500 μm intervenes between the light-sensitive polymerizable layer and the sheet.

The second embodiment of the invention is an image forming method comprising the steps of:

imagewise exposing to light a light-sensitive material which comprises a support and a light-sensitive polymerizable layer containing silver halide, a reducing agent and an ethylenically unsaturated polymerizable compound or a cross-linkable polymer, any of said silver halide, said reducing agent, said polymerizable compound and said polymer not being encapsulated in the layer; and simultaneously or thereafter heating the light-sensitive material at a temperature of not lower than 70° C. to develop the silver halide and harden the ethylenically unsaturated polymerizable compound or the cross-linkable polymer, whereby a hardened image is formed on the light-sensitive material, wherein the heat development is conducted by heating the light-sensitive material from side of the layer under conditions that a surface of the light-sensitive polymerizable layer is covered with a cover sheet and that a space of 0.5 to 500 μm intervenes between the light-sensitive polymerizable layer and the sheet.

The third embodiment of the invention is an image forming method comprising the steps of:

imagewise exposing to light a light-sensitive material which comprises a support and a light-sensitive polymerizable layer containing silver halide, a reducing agent and an ethylenically unsaturated polymerizable compound or a cross-linkable polymer, any of said silver halide, said reducing agent, said polymerizable compound and said polymer not being encapsulated in the layer; and simultaneously or thereafter heating the light-sensitive material at a temperature of not lower than 70° C. to develop the silver halide and harden the ethylenically unsaturated polymerizable compound or the cross-linkable polymer, whereby a hardened image is formed on the light-sensitive material, wherein the heat development is conducted by heating the light-sensitive material from side of the layer under conditions that a surface of the light-sensitive polymerizable layer is covered with a heating means and that a space of 0.5 to 500 μm intervenes between the light-sensitive polymerizable layer and the heating means.

The present inventors have further studied the method of forming a lithographic plate or a color proof without use of microcapsules, and have found that the above-mentioned image forming method can solve the problems caused by covering the surface of the light-sensitive polymerizable layer with a sheet or a heating means.

According to further study of the inventors, the light-sensitive polymerizable layer releases a small amount of gas (e.g., nitrogen, carbon dioxide) at the heat development. Further, the light-sensitive polymerizable layer uniformly containing a polymerizable compound or a cross-linkable polymer has a smooth surface compared with a layer containing microcapsules. If the smooth surface of the light-sensitive polymerizable layer is directly covered with a sheet or a heating means, the gas forms bubbles between the layer and the sheet or the heating means. The present inventors finally understand from these results that the bubbles cause unevenness of the obtained image.

The inventors furthermore note that the influence of oxygen can be prevented by the sheet or the heating means, even if a space of 0.5 to 500 μm intervenes between the light-sensitive polymerizable layer and the sheet or the heating means because the gas released from the light-sensitive polymerizable layer is charged into the space.

For the reasons mentioned above, the developing reaction of silver halide and the hardening reaction of the polymerizable compound or the cross-linkable polymer smoothly and uniformly proceed according to the image forming method of the present invention. Moreover, the surface of the light-sensitive polymerizable layer does not adhere to a cover sheet or a heating means because a space intervenes between the layer and the sheet or the heating means. Accordingly, the sheet or the heating means can be used repeatedly.

In the first embodiment of the present invention, the light-sensitive polymerizable layer is directly heated from the side of the support. Accordingly, the thermal efficiency is best in the first embodiment.

In the second embodiment of the invention, the layer is indirectly heated through the space and the sheet. Accordingly, the second embodiment has an advantage that there is no specific limitation with respect to the shape and kind of the heating means.

The third embodiment does not use a cover sheet. Accordingly, the third embodiment has an advantage that the mechanism of the heat development apparatus can be constructed as the simplest structure.

DETAILED DESCRIPTION OF THE INVENTION

According to the present invention, the heat development is conducted by covering a surface of the light-sensitive polymerizable layer with a cover sheet or a heating means while a space of 0.5 to 500 μm intervenes between the light-sensitive polymerizable layer and the sheet or the heating means. Preferably at least 70% of the surface of the layer is covered with the sheet or the heating means through the space.

Figure 1:
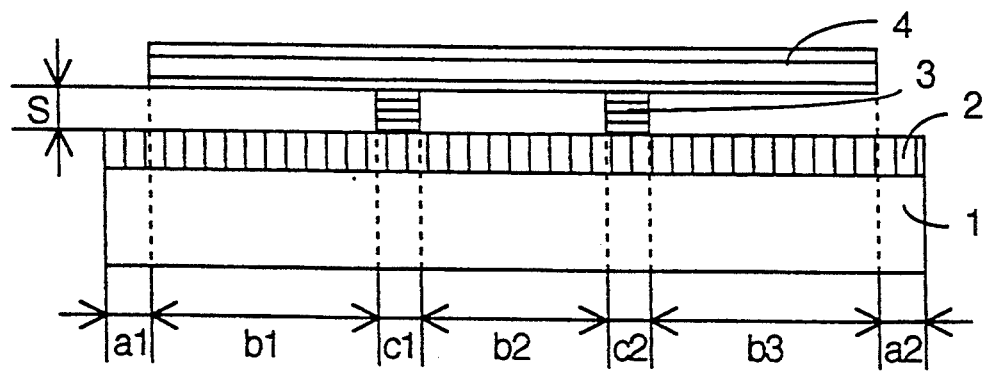
FIG. 1 is a sectional view schematically illustrating the heat development of the present invention.

The meaning of "at least 70%" is described in more detail referring to FIG. 1. FIG. 1 is a sectional view schematically illustrating the heat development of the present invention.

As is shown in FIG. 1, the light-sensitive material comprises a support (1) and a light-sensitive polymerizable layer (2). At the heat development, the surface of the light-sensitive layer is covered with a sheet or a heating means (4). A spacer (3) is placed between the layer (2) and the sheet or the heating means (4) to form a space between them. The thickness of the space (S) is 0.5 to 500 μm.

The surface of the light-sensitive polymerizable layer may partially be open to the air, as is shown in FIG. 1 (the areas a1 and a2). The open areas should be small as possible. The surface of the layer preferably is not opened. Further, the surface may partially be contacted with the spacer (3) or the sheet or the heating means (4), as is shown in FIG. 1 (the areas c1 and c2). However, at least 70% of the surface must be covered with the sheet or the heating means (4) through a space (the areas b1, b2 and b3). Accordingly, the definition of "at least 70%" means the following formula.

$$0.7 \leq (b1+b2+b3)/(a1+a2+b1+b2+b3+c1+c2)$$

According to the first and second embodiments, the surface of the light-sensitive polymerizable layer is covered with a sheet.

The thickness of the cover sheet is usually not less than 5 μm, preferably not less than 25 μm, more preferably not less than 50 μm, and most preferably not less than 70 μm. In the first embodiment, there is no specific limitation with respect to the upper limit of the thickness of the sheet, since the light-sensitive material is heated from the side of the support. In the second embodiment, the thickness of the sheet is preferably not more than 3 mm, and more preferably not more than 1 mm in view of thermal conduction because the material is heated from the side of the sheet.

Various known films, membranes, plates and boards are available as the cover sheet. Examples of the sheets include a plastic film, a metal plate, a rubber plate, ceramic plate, a metallized plastic film. Examples of the plastics include polyester, polyimide, polyethylene, polypropylene, polystyrene, polyacrylic ester, polyvinyl acetal, styrene-butadiene copolymer, styrene-butadiene-acrylonitrile copolymer and silicone resin. Examples of the metals include iron, aluminum and copper.

According to the third embodiment, the surface of the light-sensitive layer is covered with a heating means in place of the cover sheet. The heating means is described later in more detail.

In the present invention, a space of 0.5 to 500 μm intervenes between the light-sensitive polymerizable layer and the sheet or the heating means. The thickness of the space is preferably not less than 1 μm, more preferably not less than 10 μm, and most preferably not less than 20 μm. Further, the thickness is preferably not more than 400 μm, more preferably not more than 300 μm, and most preferably not more than 200 μm.

The space intervenes between the light-sensitive polymerizable layer and the sheet or the heating means preferably with respect to at least 70%, more preferably at least 80%, and most preferably at least 90% of the surface of the layer.

The above-mentioned space can be formed by various means, which are described in more detail referring to FIGS. 2–10. FIGS. 2–10 are oblique views schematically illustrating various embodiments of the heat development of the invention.

Figure 2:
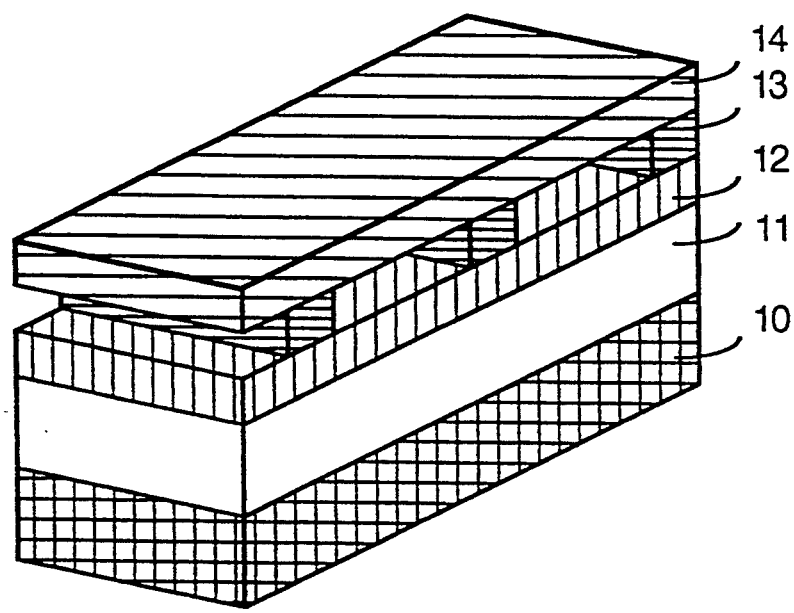
FIGS. 2–10 are oblique views schematically illustrating various embodiments of the heat development of the invention.

FIG. 2 shows a first embodiment wherein the space is formed by placing some pieces of solid substance between a layer and a sheet.

As is shown in FIG. 2, the light-sensitive material comprises a support (11) and a light-sensitive polymerizable layer (12). At the heat development, the surface of the layer is covered with a sheet (14). Some pieces of solid substance (13) are placed between the layer (12) and the sheet (14) to form a space between them. The light-sensitive material is heated from the side of the support (11) by a heating means (10).

Figure 3:
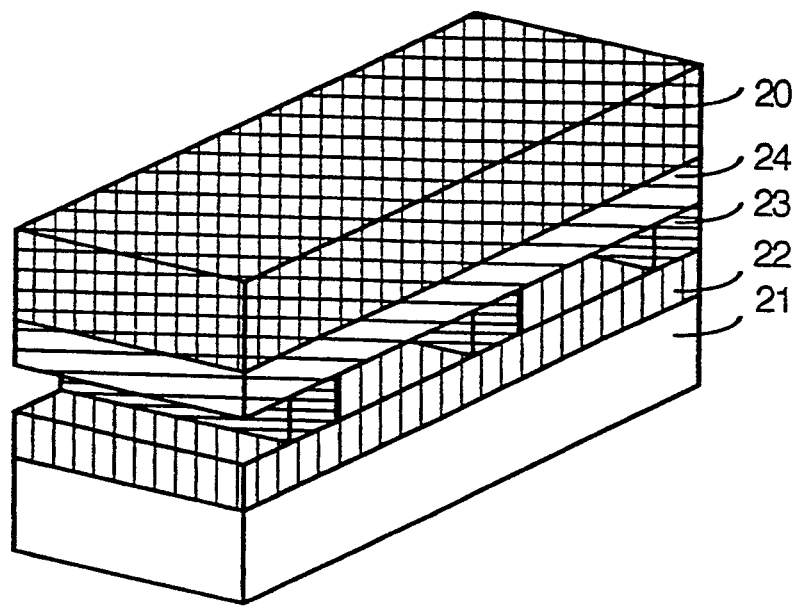

FIG. 3 shows a second embodiment wherein the space is formed by placing some pieces of solid substance between a layer and a sheet.

As is shown in FIG. 3, the light-sensitive material comprises a support (21) and a light-sensitive polymerizable layer (22). At the heat development, the surface of the layer is covered with a sheet (24). Some pieces of solid substance (23) are placed between the layer (22) and the sheet (24) to form a space between them. The light-sensitive material is heated from the side of the sheet (24) by a heating means (20).

Figure 4:
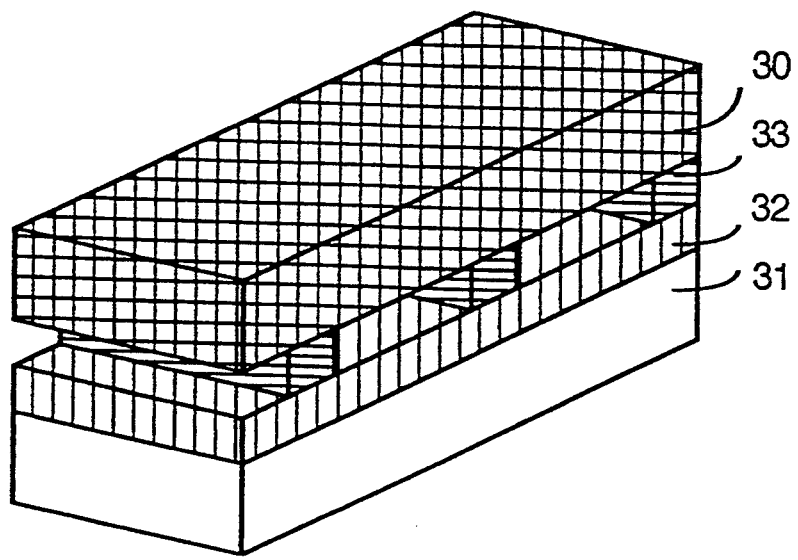

FIG. 4 shows a third embodiment wherein the space is formed by placing some pieces of solid substance between a layer and a heating means.

As is shown in FIG. 4, the light-sensitive material comprises a support (31) and a light-sensitive polymerizable layer (32). At the heat development, the surface of the layer is covered with a heating means (30). Some pieces of solid substance (33) are placed between the layer (32) and the heating means (30) to form a space between them. The light-sensitive material is heated by the heating means (30).

The pieces of solid substance can be easily made from a cork board, a rubber plate, a metal plate, a wood board or other substances used in the cover sheet. The substance should be stable at the temperature of the heat development.

The pieces of solid substance are usually placed after the imagewise exposure. However, the pieces may be placed on the light-sensitive material after or in preparation of the material and before the imagewise exposure in the case that the pieces are not obstacle to the exposure.

Figure 5:
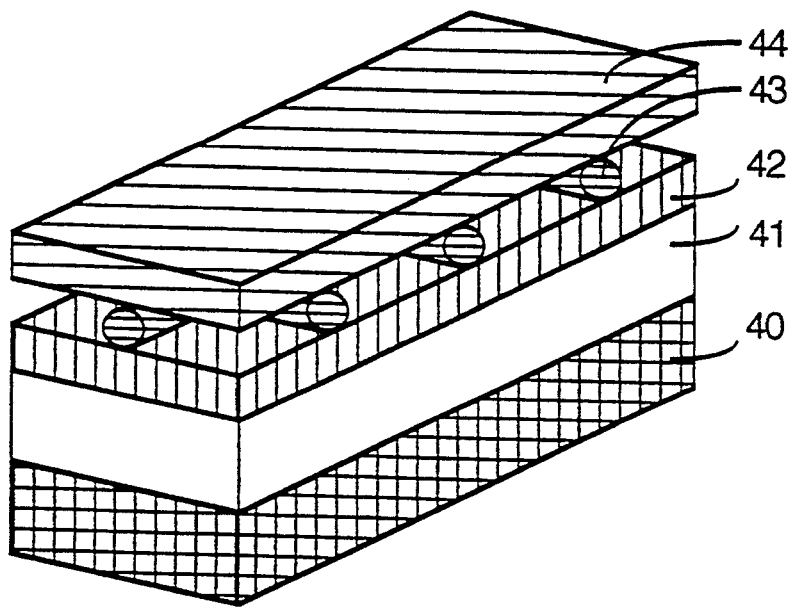

FIG. 5 shows a first embodiment wherein the space is formed by placing a net between a layer and a sheet.

As is shown in FIG. 5, the light-sensitive material comprises a support (41) and a light-sensitive polymerizable layer (42). At the heat development, the surface of the layer is covered with a sheet (44). A net (43) is placed between the layer (42) and the sheet (44) to form a space between them. The light-sensitive material is heated from the side of the support (41) by a heating means (40).

Figure 6:
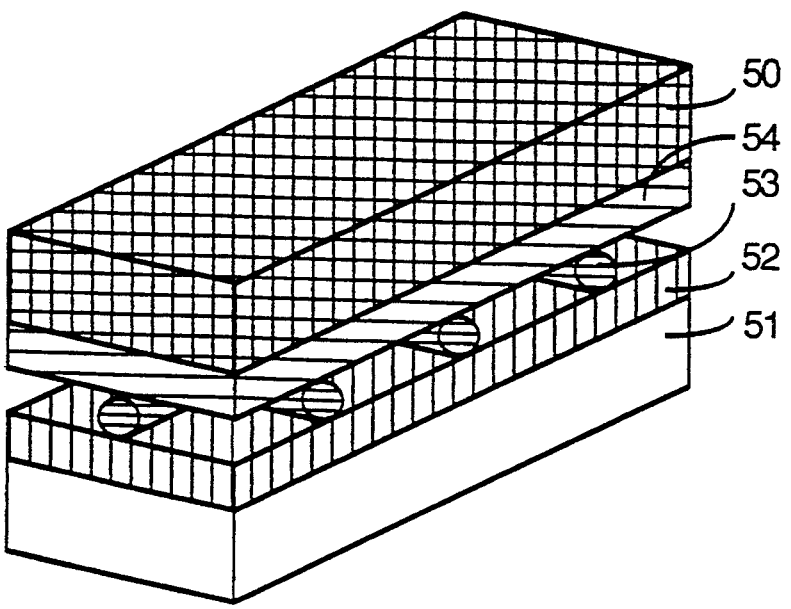

FIG. 6 shows a second embodiment wherein the space is formed by placing a net between a layer and a sheet.

As is shown in FIG. 6, the light-sensitive material comprises a support (51) and a light-sensitive polymerizable layer (52). At the heat development, the surface of the layer is covered with a sheet (54). A net (53) is placed between the layer (52) and the sheet (54) to form a space between them. The light-sensitive material is heated from the side of the sheet (54) by a heating means (50).

Figure 7:
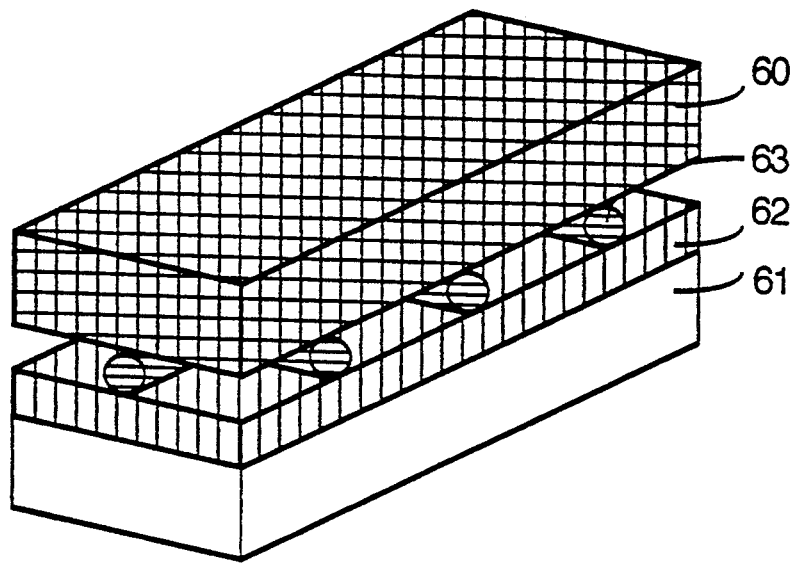

FIG. 7 shows a third embodiment wherein the space is formed by placing a net between a layer and a heating means.

As is shown in FIG. 7, the light-sensitive material comprises a support (61) and a light-sensitive polymerizable layer (62). At the heat development, the surface of the layer is covered with a heating means (60). Some pieces of solid substance (63) are placed between the layer (62) and the heating means (60) to form a space between them. The light-sensitive material is heated by the heating means (60).

The net may have a lattice structure or a network structure. The net can easily be made of a Nylon mesh or a Teflon mesh. The substance of the net should be stable at the temperature of the heat development.

The net is usually placed after the imagewise exposure. However, the net may be placed on the light-sensitive material after or in preparation of the material and before the imagewise exposure in the case that the net is not obstacle to the exposure.

Figure 8:
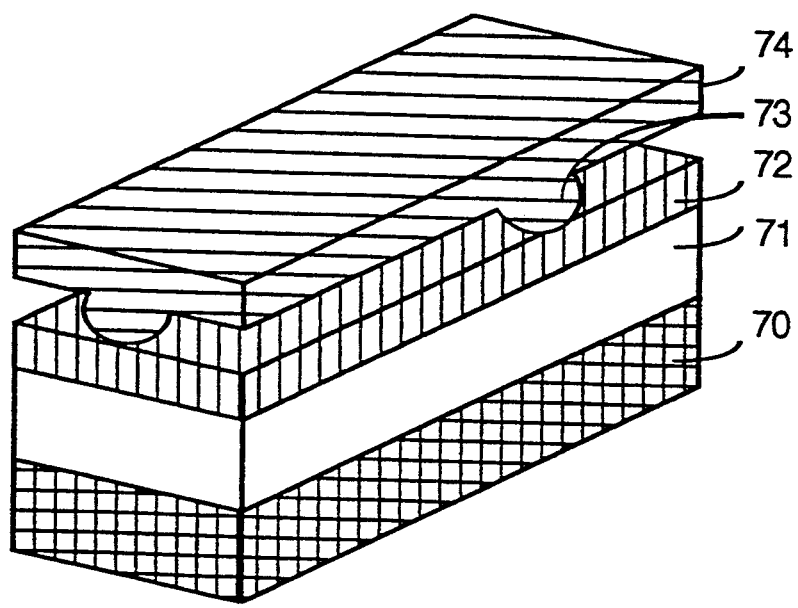

FIG. 8 shows a first embodiment wherein the space is formed by a rough surface of a sheet.

As is shown in FIG. 8, the light-sensitive material comprises a support (71) and a light-sensitive polymerizable layer (72). At the heat development, the surface of the layer is covered with a sheet (74). The sheet has a rough surface with a projection (73). A space is formed between the layer (72) and the sheet (74) with the projection (73). The light-sensitive material is heated from the side of the support (71) by a heating means (70).

Figure 9:
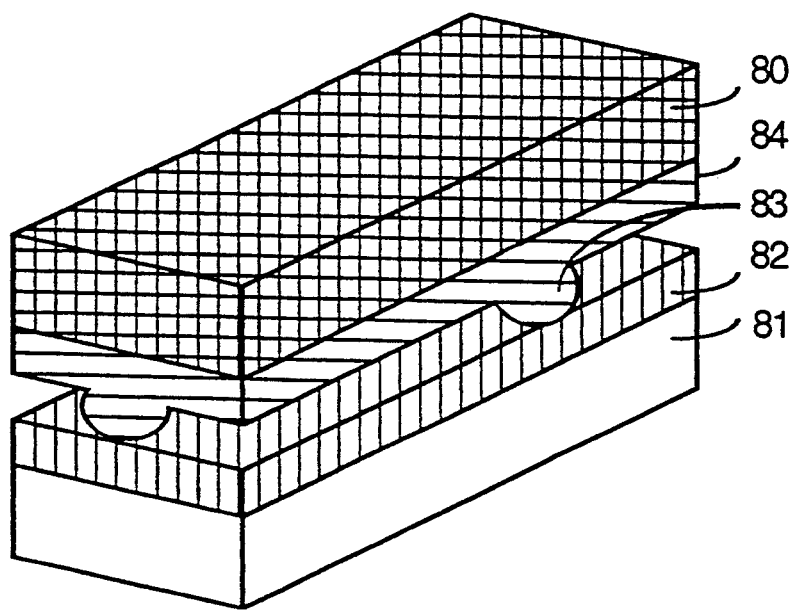

FIG. 9 shows a second embodiment wherein the space is formed by a rough surface of a sheet.

As is shown in FIG. 9, the light-sensitive material comprises a support (81) and a light-sensitive polymerizable layer (82). At the heat development, the surface of the layer is covered with a sheet (84). The sheet has a rough surface with a projection (83). A space is formed between the layer (82) and the sheet (84) with the projection (83). The light-sensitive material is heated from the side of the sheet (84) by a heating means (80).

Figure 10:
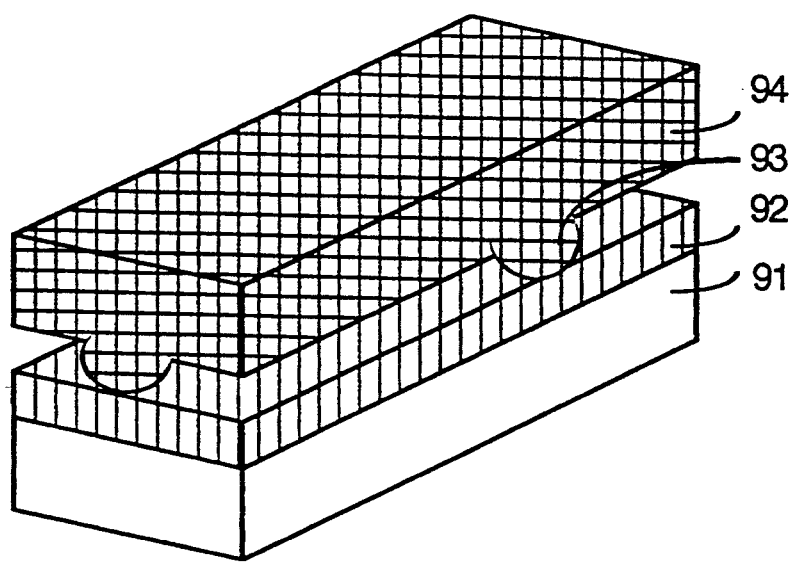

FIG. 10 shows a third embodiment wherein the space is formed by a rough surface of a heating means.

As is shown in FIG. 10, the light-sensitive material comprises a support (91) and a light-sensitive polymerizable layer (92). At the heat development, the surface of the layer is covered with a heating means (90). The heating means has a rough surface with a projection (93). A space is formed between the layer (92) and the heating means (90) with the projection (93). The light-sensitive material is heated by the heating means (90).

The height of the projection on the rough surface of the sheet or the heating means is not less than 0.5 μm, preferably not less than 1 μm, and more preferably not less than 3 μm. The height of the projection is also not more than 200 μm, preferably not more than 100 μm, and more preferably not more than 75 μm.

The area of the projection on the rough surface is preferably less than 30%, more preferably less than 20% and most preferably less than 10%.

The rough surface of the sheet or the heating means can be made by various means. For example, a rough surface can be formed by mechanically cutting a surface of a sheet or a heating means according to a sandblasting or brushing method. The rough surface can also be formed by an embossing treatment. Further, a gravure printing can form a rough surface. A layer containing solid particles (matting agent) can be coated or printed on the sheet or the heating means to form the rough surface. The solid particles may be contained in the sheet. Furthermore, the rough surface may be formed by a solvent treatment, a corona discharge treatment, a plasma treatment, an electron irradiation or a X-ray irradiation. Two or more means can be used in combination to form the rough surface.

The solid particles are preferably used. The gravure printing is also preferably used.

Metal particles, metal oxide particles, and organic or inorganic polymer or oligomer particles are available as the solid particles. Examples of the solid particles include copper powder, tin powder, iron powder, zinc oxide powder, silicon oxide powder, titanium dioxide powder, aluminum oxide powder, molybdenum disulfide, calcium carbonate, clay, mica, cornstarch, boron nitride particles, silicon resin particles, polystyrene resin particles, fluororesin particles, acrylic resin particles, polyester resin particles, acrylonitrile copolymer resin particles, zinc stearate and calcium behenate. The average particle size is preferably not less than 0.5 μm, and more preferably not less than 1.0 μm. In the case that the particles are attached to the surface of the sheet or the heating means, or in the case that a layer containing the particles are provided on the sheet or the heating means, the thickness of the formed space almost corresponds to the average particle size. In the case that the particles are contained in the sheet, the thickness of the formed space depends on the average particle size and the thickness of the sheet. In the last case, the appropriate particle size should be experimentally determined the thickness of the sheet.

According to the gravure printing, a resin can be printed on a sheet or a heating means to form a rough surface. The gravure printing is described in Japanese Patent Publications No. 56(1981)-11944 and No. 61(1986)-11673. Various screen patterns can be used in the gravure printing. For example, a round dot screen, a white line screen, a halftone gravure and Helioklischee are available. The size of the pattern is preferably in the range of 10 to 200 mesh. This range is usually used in a conventional gravure printing. A projection of 1 to 10 μm can be formed by the gravure printing. Various paints used in the conventional printing are available as the resin forming the projection. The above-mentioned particles (matting agent) can be added to the resin.

Various heating means are available at the heat development. In the second embodiment of the present invention, there is no specific limitation with respect to the heating means. In the first embodiment, the heating means should uniformly heat the light-sensitive polymerizable layer because the layer is directly heated by the heating means. In the third embodiment, the heating means should have a surface that covers a surface of the light-sensitive polymerizable layer. The light-sensitive material is usually heated while keeping contact with a heating means (e.g., a heated roller, a hot plate). The light-sensitive material may also be indirectly heated by irradiation of infrared rays.

The first embodiment of the present invention can be combined with the second embodiment. The first embodiment can also be combined with the third embodiment. In the combinations of the embodiments, the light-sensitive material is heated from the both sides (support side and layer side). In this combined case, the light-sensitive material may be placed in a heated zone (heated gas or liquid), or passed through the heated zone.

The heating temperature is not lower than 70° C., and preferably in the range of 70° to 200° C. The heating time is preferably in the range of 1 to 180 seconds.

At the heat development, the latent image of silver halide is developed, and an oxidation product of the reducing agent is formed within the exposed area. In the case that the oxidation product has a function of accelerating a polymerization reaction, an ethylenically unsaturated polymerizable compound or a cross-linkable polymer is hardened within the exposed area. In the case that the oxidation product has a function of inhibiting a polymerization reaction, an ethylenically unsaturated polymerizable compound or a cross-linkable polymer is hardened within the unexposed area.

Next, the exposing step is described below.

The light-sensitive material can be imagewise exposed to light from the surface of the layers (the reverse side of the support). The material can also be imagewise exposed to light from the side of the support.

Examples of the exposing methods include a reflective exposure, a contact exposure through a transparent positive and a scanning exposure. The reflective exposure uses a xenon lamp, a tungsten lamp or a fluorescent lamp as the light source. The scanning exposure uses a laser beam or a light emission diode as the light source.

The wavelength of the light corresponds to the spectral sensitivity of silver halide. Near ultraviolet, visible and near infrared regions are available. The amount of the exposure is generally determined by a sensitivity of the silver halide emulsion. The amount is usually in the range of 0.01 to 10,000 ergs/cm$^2$. At the exposing step, a latent image of silver halide is formed within the exposed area.

According to the above-mentioned exposing step and the heat development step, a hardened image can be formed on the light-sensitive layer. The hardened image is used in various technical fields. If necessary, some post treatment can be applied to the hardened image. Examples of the post treatment include a removing step, a transferring step and a toning step.

The removing step is conducted by a solvent (an etching solution) or a sheet. The unhardened area of the light-sensitive polymerizable layer can be selectively removed with the solvent. The unhardened or hardened area of the layer can also be selectively removed with the sheet.

At the transferring step, the unhardened or hardened area of the light-sensitive polymerizable layer is selectively transferred to an image receiving material. Thus an image is formed on the image receiving material.

At the toning step, a toner is selectively applied to the unhardened or hardened area of the light-sensitive polymerizable layer.

In the practical image formation, the above-mentioned steps can be combined with the exposure and the heat development steps. These steps have been well known, and described in the prior art references cited in the Background of the Invention of the present specification.

The layered structure and the components of the (single-layered or multi-layered) light-sensitive material used in the image forming method of the present invention are described below.

According to the present invention, an ethylenically unsaturated polymerizable compound or a cross-linkable polymer is uniformly contained in a light-sensitive polymerizable layer without use of microcapsules.

The light-sensitive polymerizable layer preferably comprises a light-sensitive layer containing the silver halide and a polymerizable layer containing the ethylenically unsaturated polymerizable compound or the cross-linkable polymer. The thickness of the light-sensitive layer is preferably in the range of 0.1 to 20 μm, and more preferably in the range of 0.5 to 10 μm. The thickness of the polymerizable layer is preferably in the range of 0.1 to 20 μm, and more preferably in the range of 0.3 to 7 μm.

Other optional layers such as a strippable layer, an undercoating layer, an overcoating layer (e.g., a protective layer or a cover sheet), an intermediate layer and a backing layer can be provided on the light-sensitive material. The undercoating layer is provided on the support. The overcoating layer is provided as the uppermost layer. The intermediate layer is provided between the functional layers. The backing layer is provided on the reverse side of the light-sensitive polymerizable layer (the back side of the support).

[Silver halide]

Silver halide is silver chloride, silver bromide, silver iodide, silver chlorobromide, silver chloroiodide, silver iodobromide or silver chloroiodobromide in the form of grains.

Various crystal forms of silver halide grains are available. Examples of the grains include a regular crystal form such as hexahedron, octahedron or tetradecahedron, an irregular form such as spherical form or tubular form, a form having crystalline defect such as a twinning plane, and a mixed form thereof.

The silver halide grains may be extremely small grains having a grain diameter (diameter of projected area) of less than 0.01 μm, or may be relatively large grains having a diameter of more 10 μm. The silver halide emulsion may be a polydispersed emulsion or a monodispersed emulsion. The monodispersed emulsion is described in U.S. Pat. Nos. 3,574,628 and 3,655,394 and British Patent No. 1,413,748.

A tabular silver halide emulsion having an aspect ratio of not less than 5 is also available. The tubular silver halide grains can be easily prepared by processes described in Gutoff, "Photographic Science and Engineering, Vol. 14, pp. 248-257 (1970)," U.S. Pat. Nos. 4,434,226, 4,414,310, 4,433,048 and 4,439,520, and British Patent No. 2,112,157.

With respect to the crystal structure of the silver halide grains, the individual grains may have a homogeneous halogen composition or a heterogeneous halogen composition in which the composition varies from the outer surface portion to the inside portion. The grains may have a multi-layered structure. Further, the silver halide grains may be bonded with other silver halide grains having different halogen composition through epitaxial bonding. The grains may be bonded with compounds other than the silver halide such as silver rhodanate and lead oxide.

Various substances in the form of salt can be added to the silver halide according to a conventional process at the grain formation or after the grain formation. Examples of the substances include copper, thallium, lead, cadmium, zinc, a chalcogen such as sulfur, selenium and tellurium, gold, and a group III noble metal such as rhodium, iridium, iron, platinum and palladium. The conventional process is described in U.S. Pat. Nos. 1,195,432, 1,191,933, 2,448,060, 2,628,167, 2,950,972, 3,488,709, 3,737,313, 3,772,031, 4,269,927 and "Research Disclosure" (RD), No. 13,452 (June, 1975).

In the case that the light-sensitive material is exposed to light in a short time and at a high illumination, iridium ion is preferably added to the silver halide in an amount of $10^{-8}$ to $10^{-3}$ mole, and more preferably in an amount of $10^{-7}$ to $10^{-5}$ mole based on 1 mole of silver halide.

Two or more kinds of silver halide grains that differ in halogen composition, crystal habit, grain size, or other features from each other can be used in combination.

The silver halide is preferably used in the form of an emulsion. The silver halide emulsion can be prepared by a known process, which is described in "Research Disclosure" (RD), No. 17,643, pages 22 to 23 (December 1978), (Emulsion preparation and types); and "Research Disclosure," No. 18,716, p. 648, (November 1979).

The silver halide emulsion is generally used after subjecting it to physical ripening, chemical ripening and spectral sensitization. Various additives are used in those stages. The additives are described in "Research Disclosure," No. 17,643 and No. 18,716. The chemical sensitizing agent is described in No. 17,643 (page 23) and No. 18,716 (page 648, right side). The spectral sensitizing agent is described in No. 17,643 (pages 23 to 24) and No. 18,716 (page 648, right side). The supersensitizing agent is described in No. 18,716 (p. 649, right side). Other additives are also described in "Research Disclosure." For example, a sensitivity-increasing agent is described in No. 18,716 (p. 648, right side), and an antifogging agent and a stabilizer are described in No. 17,643 (pages 24 to 25) and No. 18,716 (p. 649, right side), respectively.

Silver halide grains preferably have a relatively low fogging value.

The silver halide emulsion usually is a negative type. A reversal silver halide emulsion that directly forms a positive image is also available.

[Reducing agent]

The reducing agent has a function of reducing the silver halide or a function of accelerating (or inhibiting) polymerization of the polymerizable compound or the cross-linkable polymer. There are known various reducing agents having the these functions. Examples of the reducing agents include hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2,4-disulfonamidephenols, 2,4-disulfonamidenaphthols, o- or p-acylaminophenols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones and hydrazines.

By adjusting the kind or amount of the above reducing agent, the polymerizable compound can be polymerized within the area where a latent image of the silver halide has been formed or, in the alternative, within the area where a latent image of the silver halide has not been formed. For example, the following system (A), (B) or (C) may be employed.

(A) When the reducing agent develops silver halide, the reducing agent itself is oxidized to form an oxidation product. The oxidation product is decomposed in the layer to form a radical. Thus a polymerization reaction proceeds within the area where the latent image of silver halide has been formed. In this system, hydrazines are used as the reducing agent singly or in combination with other reducing agent.

(B) In the case that the oxidation product has a function of inhibiting the polymerization, the polymerization is inhibited within the area where the latent image of silver halide has been formed. The polymerization is caused by a polymerization initiator within the area where the latent image of silver halide has not been formed. In this system, 1-phenyl-3-pyrazolidones are preferably used as the reducing agent.

(C) In the case that the reducing agent itself has a function of inhibiting the polymerization and the oxidation product has no or weak inhibiting function, the polymerization is inhibited within the area where the latent image of silver halide has not been formed. The polymerization is caused by a polymerization initiator within the area where the latent image of silver halide has been formed. In this system, hydroquinones are preferably used as the reducing agent.

In the systems (B) and (C), a polymerization initiator (a thermal polymerization initiator or a photopolymerization initiator) is contained in a layer of the light-sensitive material. The systems (B) and (C) are described in U.S. Pat. No. 4,649,098 and European Patent Publication No. 0202490.

The reducing agents (including compounds referred to as developing agent or hydrazine derivative) are described in Japanese Patent Provisional Publications No. 61(1986)-183640, No. 61(1986)-183535, No. 61(1986)-228441, No. 62(1987)-70836, No. 61(1987)-86354, No. 62(1987)-86355, No. 62(1987)-206540, No. 62(1987)-264041, No. 62(1987)-109437 and No. 63(1988)-254442, and Japanese Patent Applications No. 63(1988)-97379, No. 63(1988)-296774, No. 63(1988)-296775, No. 1(1989)-27175, No. 1(1989)-54101 and No. 1(1989)-91162. The reducing agents are also described in T. James, "The Theory of the Photographic Process," 4th edition, pages 291 to 334 (1977), "Research Disclosure," Vol. 170, No. 17029, pages 9 to 15 (June 1978), and "Research Disclosure," Vol. 176, No. 17643, pages 22 to 31 (December 1978). Further, there can be also employed a reducing agent precursor capable of releasing a reducing agent under heating or in contact with a base. Also in the light-sensitive material, various reducing agents and reducing agent precursors described in the above publications, applications and literature can be effectively used. Thus, "the reducing agent" in the present specification means to include all the reducing agents and reducing agent precursors described in the above publications.

When the reducing agent is basic, that is, it forms a salt with an acid, the reducing agent can be used in the form of a salt with an acid. The reducing agents can be used singly or in combination. In the case that two or more reducing agents are used in combination, certain interactions between those reducing agents may be expected. One of the interactions is for an acceleration of reduction of silver halide (or an organic silver salt) through so-called superadditivity. The other interaction is for a chain reaction in which an oxidant of one reducing agent formed by a reduction of silver halide (or an organic silver salt) induced or inhibits the polymerization of the polymerizable compound by oxidation-reduction reaction with other reducing agent. Both interactions may occur simultaneously. Thus, it is difficult to determine which of the interactions has occurred in practical use.

The reducing agent is used in an amount of 0.1 to 10 mole, and more preferably 0.5 to 5 mole based on 1 mole of silver halide.

[Polymerizable compound and cross-linkable polymer]

The polymerizable compound used in the present invention has an ethylenic unsaturated group.

Examples of the compounds having an ethylenic unsaturated group include acrylic acids, salts of acrylic acids, acrylic esters, acrylamides, methacrylic acids, salts of methacrylic acids, methacrylic esters, methacrylamides, maleic anhydride, maleic esters, itaconic esters, styrenes, vinyl ethers, vinyl esters, N-vinyl heterocyclic compounds, allyl ethers, allyl esters, and derivatives thereof.

Acrylic esters and methacrylic esters are preferred.

Examples of the acrylic esters include n-butyl acrylate, cyclohexyl acrylate, 2-ethylhexyl acrylate, benzyl acrylate, furfuryl acrylate, ethoxyethoxyethyl acrylate, tricyclodecanyloxy acrylate, nonylphenyloxyethyl acrylate, 1,3-dioxolane acrylate, hexanediol diacrylate, butanediol diacrylate, neopentyl glycol diacrylate, trimethylolpropane triacrylate, tricyclodecanedimethylol diacrylate, pentaerythritol tetraacrylate, dipentaerythritol pentaacrylate, dipentaerythritol hexacrylate, diacrylate of polyoxyethylenated bisphenol A, 2-(2- hydroxy-1,1-dimethylethyl)-5-hydroxymethyl-5-ethyl-1,3-dioxanediacrylate, 2-(2-hydroxy-1,1-dimethylethyl)-5,5-dihydroxymethyl-1,3-dioxanetriacrylate, triacrylate of propylene oxide addition product of trimethylolpropane, polyacrylate of hydroxypolyether, polyester acrylate and polyurethane acrylate.

Examples of the methacrylic esters include methyl methacrylate, butyl methacrylate, ethylene glycol dimethacrylate, butanediol dimethacrylate, neopentyl glycol dimethacrylate, trimethylolpropane trimethacrylate, pentaerythritol trimethacrylate, pentaerythritol tetramethacrylate and dimethacrylate of polyoxyalkylenated bisphenol A.

The polymerizable compound is commercially available. Examples of the commercially available compounds include Alonix M-309, M-310, M-315, M-400, M-6100, M-8030, M-8100 (trade names, all available from Toagosei Chemical Industry Co., Ltd.) and Kayarad HX-220, HX-620, R-551, TMPTA, D-330, DPHA, DPCA-60, R604, R684 (trade names, all available from Nippon Kayaku Co., Ltd.).

The cross-linkable polymer used in the present invention has a functional group that is reactive to a radical. The polymer may be a homopolymer or a copolymer with a monomer that does not have a reactive group. Examples of the polymer include a polymer having a double bond (ethylenic or another unsaturated bond) in its molecule, a polymer having a polyoxyalkylene unit in its molecule and a polymer containing a halogen atom in its molecule. A polymer that forms a polymer radical by dehalogenatation or dehydrogenation is also available as the cross-linkable polymer. Further, two polymer radicals may be coupled with each other by a cross-linking reaction. Furthermore, a polymer may be cross-linked by a reaction with an ethylenically unsaturated polymerizable compound.

The reactive functional group is contained in the side chain or the main chain. The functional group may be introduced into the side chain by a polymeric reaction of the polymer The functional group may also be introduced into the side chain by a polymerization of monomers having the group.

The other examples of the polymers include a synthetic rubber (e.g., polybutadiene, polyisoprene, styrene-isoprene copolymer, styrene-butadiene-acrylonitrile copolymer), a natural rubber, polyethylene oxide, polypropylene oxide, polyvinyl chloride (including a copolymer thereof), polyvinylidene chloride (including a copolymer thereof), polyvinyl acetate (including a copolymer thereof), chlorinated polyethylene, polyvinyl butyral, methyl cellulose, ethyl cellulose and butyl cellulose.

The cross-linkable polymer is described at pages 147 to 192 in "Polymer Reaction" (edited by Polymer Society in Japan, Kyoritsu Shuppan, 1978).

In the case that an alkaline solution is used to remove the unhardened area, the cross-linkable polymer preferably contains an acidic functional group in its molecule. Examples of the acidic functional groups include carboxyl, an acid anhydride group, phenolic hydroxyl, sulfo, sulfonamido and sulfonimido. In the case that a binder of the layer is a polymer made by an addition reaction, the cross-linkable polymer may be a copolymer of a monomer having an cross-linkable group with a monomer having an acidic group. Examples of the monomers include acrylic acid, methacrylic acid, crotonic acid, maleic acid, phthalic acid, maleic anhydride, p-carboxystyrene, p-hydroxystyrene, p-hydroxyphenylacrylamide, hydroxyethyl methacrylate, hydroxyethylmethacrylamide and p-vinylbenzenesulfonic acid.

The polymerizable compound and the cross-linkable polymer can be used singly or in combination of two or more compounds or polymers.

The amount of the polymerizable compound and the cross-linkable polymer contained in the polymerizable layer is preferably in the range of 3 to 90% by weight, more preferably in the range of 15 to 60% by weight, based on the whole amount of the polymerizable layer.

[Base and base precursor]

The light-sensitive material may contain a base or base precursor.

Various organic or inorganic bases and their precursors (e.g., decarboxylation type, thermal decomposition type, reaction type and complex salt-formation type) are available.

Inorganic bases are described in Japanese Patent Provisional Publication No. 62(1987)-209448. Examples of the organic bases include tertiary amine compounds (described in Japanese Patent Provisional Publication No. 62(1987)-170954), bisamidine compounds, trisamidine compounds or tetraamidine compounds (described in Japanese Patent Provisional Publication No. 63(1988)-316760) and bisguanidine compounds, trisguanidine compounds or tetraguanidine compounds (described in Japanese Patent Provisional Publication No. 64(1989)-68746). In the present invention, a base having a pKa value of not less 7 is preferred.

In the present invention, a base precursor is preferred to the base from the viewpoint of the storage stability of the light-sensitive material.

Preferred examples of the base precursors include salts of organic acids with bases that is decarboxylated under heating and urea compounds which release bases under heating. Examples of the reaction mechanisms of the base precursor include a reaction between the base precursor and a salt containing anion having higher compatibility with transition metal acetylide or transition metal ion than acetylide anion, and a reaction of introducing into water both of a basic metallic compound which is hardly dissolved in water and a compound capable of reacting with metal ion of the basic metallic compound in a water medium to form a complex salt so as to release a base through a reaction between those two compounds in the presence of water.

The base precursor preferably releases a base at a temperature in the range of 50° to 200° C., and more preferably in the range of 80° to 160° C.

The base or the base precursor can be used in an amount of preferably 0.5 to 50 mole, and more preferably 1 to 20 mole based on 1 mole of silver halide.

[Pigment]

The light-sensitive material may contain a pigment.

The pigments are commercially available. Further, pigments are described in various publications such as "Handbook of Color Index,""New Handbook of Pigments," (Nippon Ganryo Gijutsu Kyokai (ed.), 1977), "New Applied Technique of Pigments," (CMC Publishing, 1986), and "Technique of Printing Ink," (CMC Publishing, 1984).

Examples of the pigments include black pigments, yellow pigments, orange pigments, brown pigments, red pigments, violet pigments, blue pigments, green pigments, fluorescent pigments, metal powder pigments and polymer pigments. Concrete examples of the pigments include insoluble azo pigments, azo lake pigments, condensation azo pigments, chelate azo pigments, phthalocyanine pigments, anthraquinone pigments, perylene pigments, perynone pigments, thioindigo pigments, quinacridone pigments, dioxadine pigments, isoindolinone pigments, quinophthalone pigments, dye-type lake pigments, azine pigments, nitroso pigments, nitro pigments, natural pigments, fluorescent pigments and inorganic pigments.

The pigment can be per se used or can be used after being subjected to surface treatment. As the surface treatment, there can be employed a method of coating a resin or wax on the surface of the pigment, a method of depositing a surface active agent thereon, a method of bonding a reactive substance (e.g., silane coupling agent, epoxy compound and polyisocyanate) to the surface of the pigment. Those methods are described, for example, in "Nature and Application of Metal Soap," (Saiwai Shobo), "Technique of Printing Ink," (CMC Publishing, 1984), and "New Applied Technique of Pigments," (CMC Publishing, 1986).

The upper limit of the amount of the pigment is determined provided that the pigment does not remarkably inhibit the hardening reaction, the sensitivity of silver halide or the developing reaction. The color density depends on the nature of each of the pigments. The amount is usually in the range of 0.01 to 2 g/m$^2$, and more preferably in the range of 0.02 to 1 g/m$^2$.

Two or more pigments may be used in combination.

[Support]

The support of the light-sensitive material is made from a chemically and thermally stable substance. If necessary, the support may be transparent. Examples of the substances for the support include polyolefins (e.g., polyethylene, polypropylene), halogenated polyvinyls (e.g., polyvinyl chloride, polyvinylidene chloride), cellulose derivatives (e.g., cellulose acetate, cellulose nitrate, cellophane), polyamides, polystyrene, polycarbonate, polyimides and polyesters. Polyethylene terephthalate and polycarbonate are preferred, since they have excellent dimensional stability and transparency. Polyethylene terephthalate and polycarbonate supports may be thermally treated. Biaxially stretched polyethylene terephthalate is particularly preferred. A metal (e.g., aluminum) support is also available. The surface of the support can be treated, for example with corona discharge, ultraviolet irradiation or an undercoating layer.

The support preferably has a thickness of 50 to 300 μm, and more preferably of 70 to 150 μm.

[Binder of polymerizable layer]

A binder may be added to the polymerizable layer of the multi-layered light-sensitive material to enhance the strength of the layer. The binder preferably does not decrease the solubility of the unhardened area of the polymerizable layer in the solvent. The binder also preferably does not increase the solubility of the hardened area in the solvent. Various natural or synthetic polymers are available as the binder. The synthetic polymer can be formed by an addition reaction (of a vinyl monomer) or a condensed reaction. Examples of the synthetic polymers include vinyl polymers (e.g., polystyrene, polyacrylate, polymethacrylate), polyesters, polyamides, polyurethanes, polyester-polyamides and copolymers thereof.

In the case that an alkaline solution is used to remove the unhardened area, the binder preferably contains an acidic functional group in its molecule. Examples of the acidic functional groups include carboxyl, an acid anhydride group, phenolic hydroxyl, sulfo, sulfonamido and sulfonimido. In the case that the binder is a polymer made by an addition reaction, the binder may be a copolymer of a monomer having an cross-linkable group with a monomer having an acidic group. Examples of the monomers include acrylic acid, methacrylic acid, crotonic acid, maleic acid, phthalic acid, maleic anhydride, p-carboxystyrene, p-hydroxystyrene, p-hydroxyphenylacrylamide, hydroxyethyl methacrylate, hydroxyethylmethacrylamide and p-vinylbenzenesulfonic acid.

There is not specific limitation on the amount of the binder so long as the binder does not inhibit the hardening reaction in the polymerizable layer. The amount is usually in the range of 0 to 80 % by weight, and preferably in the range of 0 to 70% by weight, based on the whole amount of the polymerizable layer.

[Polymerization inhibitor]

A polymerization inhibitor may be added to the polymerizable layer to prevent the dark reaction. Various known polymerization inhibitors are available. Examples of the polymerization inhibitors include a nitrosoamine, a thiourea, a thioamide, a urea compound, a phenol derivative, a nitrobenzene derivative and an amine. Concrete examples include Al salt of cupferron, N-nitrosodiphenylamine, allylthiourea, an aryl phosphate, p-toluidine, $\phi$-toluquinone, nitrobenzene, pyridine, phenathiazine, $\beta$-naphthol, naphthylamine, t-butylcatechol, phenothiazine, chloranil, p-methoxyphenol, pyrogallol, hydroquinone and an alkyl or aryl-substituted hydroquinone.

[Organic metallic salt]

An organic metallic salt can be added to the light-sensitive layer containing silver halide. The organic metallic salt relates to an oxidation-reduction reaction at the heat development wherein the latent image of silver halide functions as the catalyst. It is considered that the organic metallic salt has a function of accelerating the oxidation-reduction reaction. The organic silver salt is described in Japanese Patent Provisional Publications No. 59(1984)-55429 and No. 62(1987)-3246.

The metal of the organic salt preferably is silver. The organic moiety of the salt preferably is an aliphatic carboxylic acid, an aromatic carboxylic acid, a thiocarbonyl compound having a mercapto group or $\alpha$-hydrogen, an acetylene compound and an imino compound.

Examples of the aliphatic carboxylic acids include acetic acid, butyric acid, succinic acid, sebacic acid, adipic acid, oleic acid, linoleic acid, linolenic acid, tartaric acid, palmitic acid, stearic acid, behenic acid and camphoric acid. When the number of the carbon atoms is small, the formed silver salt is unstable. Therefore, the carboxylic acid should contain a relatively large number of the carbon atoms.

Examples of the aromatic carboxylic acids include benzoic acid derivatives, quinolinic acid derivatives, naphthoic acid derivatives, salicylic acid derivatives, gallic acid, tannic acid, phthalic acid, phenylacetic acid derivatives and pyromellitic acid.

Examples of the thiocarbonyl compounds include 3-mercapto-4-phenyl-1,2,4-triazole, 2-mercaptobenzimidazole, 2-mercapto-5-aminothiadiazole, 2-mercaptobenzothiazole, s-alkylthioglycolic acid (the number of the carbon atoms in the alkyl group is in the range of 12 to 22), dithiocarboxylic acids (e.g., dithioacetic acid), thioamides (e.g., thiostearamide), 5-carboxy-1-methyl-2-phenyl-4-thopyridine, mercaptotriazine, 2-mercaptobenzoxazole and 3-amino-5-benzylthio-1,2,4-triazole.

The mercapto compounds described in U.S. Pat. No. 4,123,274 are also available.

Examples of the imino compounds include benzotriazole and derivatives thereof, 1,2,4-triazole, 1H-tetrazole, carbazole, saccharin, imidazole and derivatives thereof. Examples of the benzotriazole derivatives include alkyl-substituted benzotriazoles (e.g., methylbenzotriazole), halogen-substituted benzotriazoles (e.g., 5-chlorobenzotriazole), carboimidobenzotriazoles (e.g., butylcarboimidobenzotriazole), nitrobenzotriazoles, sulfobenzotriazoles, carboxybenzotriazoles and salts thereof and hydroxybenzotriazoles. U.S. Pat. No. 4,220,709 describes 1,2,4-triazole and 1H-tetrazole.

A similar effect can be obtained in the case that the organic moiety of the organic metallic salt in place of the salt itself is added to the light-sensitive layer. Two or more organic metallic salts can be used in combination.

The organic silver salt is generally used in an amount of 0 to 10 moles, preferably 0 to 1 mole based on 1 mole of silver halide. The total amount of the silver halide and the organic silver salt contained in the light-sensitive layer is preferably in the range of 1 mg/m$^2$ to 5 g/m$^2$, more preferably in the range of 10 mg/m$^2$ to 0.5 g/m$^2$ in terms of silver.

[Binder of light-sensitive layer]

A hydrophilic binder is preferably contained in the light-sensitive layer.

The hydrophilic binder has a hydrophilic group or a hydrophilic bond in its molecule. Examples of the hydrophilic group include carboxyl, hydroxyl (including alcohol and phenol), sulfo, sulfonamido, sulfonimido and amido. Examples of the hydrophilic bond include urethane bond, ether bond and amido bond.

The hydrophilic binder preferably is soluble in water or swells in water. The polymer that swells in water has an affinity to water, but is not soluble in water because of the cross-linking structure of the polymer.

The natural or synthetic polymers can be used as the hydrophilic binder. Examples of the natural hydrophilic polymer include polysaccharide such as starch derivatives, cellulose derivatives, alginic acid, pectic acid, gum arabic and pullulan, and protein such as casein and gelatin. The denatured polymers are also available. In preparation of the light-sensitive material (at the stage of coating or drying), these natural polymers may be denatured or crosslinked. The synthetic hydrophilic polymer is a polymer or copolymer of water-soluble monomers. The water-soluble monomers have a hydrophilic group such as carboxyl, acid anhydride, hydroxyl, sulfo (including a salt thereof), amido, amino and ether. Examples of the monomer are described in "Application and Market of Water-soluble Polymer" (CMC, p. 16–18). A copolymer formed from the above-mentioned monomers by polymerization or cross-linking (copolymers described in U.S. Pat. No. 4,913,998) can also be used.

The other examples of the hydrophilic polymer include polyvinyl alcohol, polyvinyl ether, polyvinyl pyrrolidone and derivatives thereof. Polyvinyl alcohol is particularly preferred.

Polyvinyl alcohol may be denatured by copolymerization with another monomer. A copolymer of vinyl acetate and another monomer is saponified to form the denatured polyvinyl alcohol. Examples of the monomer copolymerized with the vinyl acetate include ethylene, a higher vinyl carboxylate, a higher alkyl vinyl ether, methyl methacrylate and acrylamide. Polyvinyl alcohol may also be denatured after the saponification. Hydroxyl in polyvinyl alcohol can be modified by etheration, esterification or acetylation. A cross-linked polyvinyl alcohol is also available. Examples of the cross-linking agent include aldehyde, methylol compounds, diisocyanate, divinyl compounds, dicarboxylic acids, borates, titanium and copper. The denatured or crosslinked polyvinyl alcohol is described in "Poval" 3rd edition, Kobunshi Kanko-Kai, p. 281-285 and 256-260.

The molecular weight is preferably in the range of 3,000 to 500,000. The hydrophilic polymer binder is preferably used in an amount in the range of 0.05 g to 20 g/m$^2$, and more preferably in the range of 0.1 to 10 g/m$^2$.

The light-sensitive layer preferably has a function of preventing oxygen from the air to the polymerizable layer at the heat development process. The oxygen functions as a polymerization inhibitor. Therefore, the hydrophilic polymer preferably has a low transmission coefficient of oxygen of not more than $1.0 \times 10^{-11}$ cm$^3$.cm/cm$^2$.sec.cmHg.

The examples of the hydrophilic polymer binder having the low transmission coefficient of oxygen include polyvinyl alcohol and its derivatives, gelatin and copolymer of vinylidene chloride. The derivatives of polyvinyl alcohol include the above-mentioned denatured polyvinyl alcohol (formed by saponification of the block copolymer of polyvinyl acetate and another monomer). The molecular weight is preferably in the range of 3,000 to 500,000.

Polyvinyl alcohol preferably has a high saponification degree of not less than 70%, more preferably of not less than 80%, most preferably of not less than 95%. The polyvinyl alcohol having the high saponification degree has a very low transmission coefficient of oxygen.

[Heat development accelerator]

The light-sensitive material can contain a heat development accelerator. The heat development accelerator may be contained in any layers of the light-sensitive material. The function of the heat development accelerator has not yet been analyzed. There are two assumptions. According to one assumption, the heat development accelerator has a function of increasing the plasticity of a polymer (contained in the polymerizable layer or the light-sensitive layer). According to the other assumption, the accelerator has another function of accelerating the dispersion of the components in the layers when it is dissolved by heat of the development process. As a result, the reactions (decomposition of a base precursor, reduction of silver halide and a hardening reaction) at the heat development process are accelerated.

The heat development accelerator has been known as a plasticizer. The known plasticizers are described in "Plastic Additives (written in Japanese)," p. 21–63 (Taisei-sha); Plastics Additives, Second Edition; Hanser Publishers, Chapter 5, p. 251–296; Thermoplastic Additives, Marcel Dekker Inc., Chapter 9, p. 345–379; Plastic Additives, An Industrial Guide, Noyes Publications, Section 14, p. 333–485: The Technology of Solvents and Plasticizers, John Willey & Sons Inc., Chapter 15, p. 903–1027; Industrial Plasticizers, Pergamon Press; Plasticizer Technology, Vol. 1, Reinhold Publishing corp.; and Plasticization and Plasticizer Process, American Chemistry.

The heat development accelerator has also been known as a hot-melt solvent. Examples of the hot-melt solvent include polar compounds described in U.S. Pat. No. 3,347,675; 1,10-decandiol, methyl anisate and biphenyl suberate described in "Research Disclosure" pages 26 to 28, (December 1976); sulfonamide derivatives; polyethylene glycol derivatives; cyclic amides; aromatic compounds; esters and amides; ethers and thioethers; ketones, carbonates, sulfoxides, phosphonates; and phenols.

Preferred examples of the heat development accelerator include glycols (e.g., diethylene glycol, dipropylene glycol), polyhydric alcohols (e.g., glycerol, butanediol, hexanediol), saccharides, formates, ureas (e.g., urea, diethylurea, ethyleneurea, propyleneurea), a urea resin, a phenol resin, amides (e.g., acetamide, propionamide) and sulfonamides. Two or more heat development accelerators can be used in combination. The heat development accelerators can be added to two or more layers of the light-sensitive material.

The amount of the heat development accelerator is preferably in the range of 0 to 2 g/m$^2$, and more preferably in the range of 0 to 1 g/m$^2$.

[The other additives]

The light-sensitive material can contain the other additives such as an antifogging agent, a silver development accelerator, a development stopping agent, a surface active agent and a dispersing agent.

The antifogging agent, the silver development accelerator and the dispersing agent often have two or more functions. Accordingly, it is difficult to classify these compounds. Examples of these compounds include cyclic amides, polyethylene glycol derivatives, thiol derivatives, acetylene compounds, sulfonamide derivatives and azoles or azaindenes described in "Research Disclosure" pages 24 to 25 (1978). These compounds are generally used in an amount of 10$^{-7}$ to 1 mole based on 1 mole of the silver halide.

The development stopping agent can be used in the light-sensitive material to obtain a clear image constantly regardless of the temperature and time for the development process. The development stopping agents are compounds to neutralize a base or react with a base to reduce the base concentration in the layer to stop development, or compounds that mutually react with silver or a silver salt to suppress development, after the appropriate development. More specifically, examples of the development stopping agents include acid precursors capable of releasing acids upon heating, electrophilic compounds capable of undergoing substitution reaction with a coexisting base upon heating, nitrogen-containing heterocyclic compounds, mercapto compounds, and precursors thereof.

[Polymerization initiator]

In the systems (B) and (C) described at the item of [Reducing agent], a thermal polymerization initiator or a photopolymerization initiator is contained in the light-sensitive material. Various known thermal polymerization initiators and photopolymerization initiators are available. When the photopolymerization initiator is used, the light-sensitive material is uniformly exposed to light after the developing step.

A thermal polymerization initiator is described in "Addition Polymerization and Ring Opening Polymerization," pages 6 to 18, edited by the Editorial Committee of High Polymer Experimental Study of the High Polymer Institute, published by Kyoritsu Shuppan (1983). Examples of the thermal polymerization initiators include azo compounds such as azobisisobutyronitrile, 1,1'-azobis(1-cyclohexanecarbonitrile), dimethyl-2,2'-azobisisobutyrate, 2,2'-azobis(2-methylbutyronitrile) and azobisdimethylbaleronitrile; organic peroxides such as benzoyl peroxide, di-t-butyl peroxide, dicumyl peroxide, t-butyl hydroperoxide and cumene hydroperoxide; inorganic peroxides such as hydrogen peroxide, potassium persulfate and ammonium persulfate; and sodium p-toluenesulfinic acid.

The photopolymerization initiator is described in Oster et al., Chemical Review, vol. 68, p. 125-151 (1968) and Kosar, Light-Sensitive System, p. 158-193, John Willey & Sons (1965). Examples of the photopolymerization initiator include carbonyl compounds (e.g., α-alkoxyphenyl ketones, polycyclic quinones, benzophenone derivatives, xanthones, thioxanthones and benzoines), halogen-containing compounds (e.g., chlorosulfonyl or chloromethyl polynuclear aromatic compounds, chlorosulfonyl or chloromethyl heterocyclic compounds, chlorosulfonyl or chloromethyl benzophenones and fluorenones), haloalkanes, α-halo-α-phenylacetophenones, redox couples of photo-reducible dye and reducing agent, organic sulfur compounds, peroxides, photo semi-conductors (e.g., titanium dioxide and zinc oxide), metallic compounds (e.g., ferrous salt, metallic salt of carbonyl compound, metal complex and uranyl salt), silver halide, azo compounds and diazo compounds.

Concrete examples of the photopolymerization initiators include 2-dimethoxy-2-phenylacetophenone, 2-methyl-[4-(methylthio)phenyl]-2-morpholino-1-propanone, benzoin butyl ether, benzoinisopropyl ether, benzophenone, Michler's ketone, 4,4-diethylaminobenzophenone, chloromethylbenzophenone, chlorosulfonylbenzophenone, 9,10-anthraquinone, 2-methyl-9,10-anthraquinone, chlorosulfonyl anthraquinone, chloromethyl anthraquinone, 9,10-phenanthrenequinone, xanthone, chloroxanthone, thioxanthone, chlorothioxanthone, 2,4-diethylthioxanthone, chlorosulfonylthioxanthone, chloromethylbenzothiazole, chlorosulfonylbenzoxazole, chloromethylquinoline, fluorene and carbon tetrabromide.

Examples of the photo-reducible dyes include methylene blue, thionine, rose bengal, erythrocin-β, eosine, rhodamine, phloxin-β, safranine, acryflavine, riboflavine, fluorescein, uranine, benzoflavine, acryzine orange, acryzine yellow and benzanthrone.

Examples of the reducing agents (hydrogen donative compounds) employable with these dyes include β-diketones (e.g., dimedone and acetylacetone), amines (e.g., triethanolamine, diethanolamine, monoethanolamine, diethylamine and triethylamine), sulfinic acids (e.g., p-toluenesulfinic acid and benzenesulfinic acid), salts of those sulfinic acids, N-phenylgrycine, L-ascorbic acid and salts thereof, thiourea, and allylthiourea.

A molar ratio between the photo-reducible dye and the reducing agent is preferably in the range of 1:0.1 to 1:10.

Also preferably employable as the photopolymerization initiators are commercially available ones such as Irgacure-651# and Irgacure-907# (produced by Ciba-Geigy).

The polymerization initiator is used in an amount of preferably 0.001 to 0.5 g, and more preferably 0.01 to 0.2 g based on 1 g of the polymerizable compound.

[Image formation accelerating layer]

An image formation accelerating layer may be provided on the light-sensitive material. The image formation accelerating layer contains ingredients with respect to image forming reaction, such as a reducing agent, a heat development accelerator, a base and base precursor. The layer is formed by coating and drying a coating solution containing the ingredients in the same manner as in formation of the light-sensitive polymerizable layer. The thickness of the image formation accelerating layer is preferably in the range of 0.3 to 20 μm, and more preferably in the range of 1 to 10 μm.

[Optional layers]

Optional layers may be added to the single-layered or multi-layered light-sensitive materials. An overcoating layer (or a cover film layer) has a function of protecting the surface of the light-sensitive material or a function of preventing oxygen in the air from inhibiting the polymerization reaction. A backing layer may function as an antihalation layer. The backing layer may also function of preventing adhesion between two light-sensitive materials when they are stocked. An intermediate layer may also function as an antihalation layer. The backing layer may also function of adjusting adhesion between two layers. A layer containing a matting agent may be provided on the surface facing an image receiving material. The matting agent has a function of contacting tightly the light-sensitive material with the image receiving material to prevent bubble formed between the materials. Various known matting agents are available. The matting agent may also be contained in the image receiving material.

An overcoating layer can be prepared by coating a solution of a polymer on a light-sensitive material. The overcoating layer can also be prepared by laminating a polymer film on the light-sensitive material. The overcoating layer may be formed by the lamination just before the image forming method. The hydrophilic binders described at the item of [Binder of the light-sensitive layer] are available as the polymer of the overcoating layer. Polyvinyl alcohols are particularly preferred. The polyvinyl alcohol preferably has a high saponification degree of not less than 85%, and more preferably of not less than 95%. The polyvinyl alcohol having the high saponification degree has a very low transmission coefficient of oxygen. The overcoating layer also functions as a protective layer. The overcoating layer may be peeled from the light-sensitive material just before the laminating step. Two or more overcoating layers may be provided on the light-sensitive material.

An adhesive layer may be provided on the light-sensitive material. The adhesive layer can be made of a mixture of a polymer and a plasticizer. The layer can also be made of a mixture of a polymer and an oligomer. Further, the layer can be made of an elastic polymer having a secondary transition point of not higher than −10° C. The layer of the elastic polymer is particularly preferred. A plasticizer or an oligomer may be added to the layer of the elastic polymer.

The polymer used in the adhesive layer preferably is a natural or synthetic rubber. Examples of the synthetic rubber include polyisobutylene, nitryl rubber, butyl rubber, chlorinated rubber, polyvinyl isobutyl ether, silicon elastomer, neoprene and a copolymer rubber (e.g., styrene-butadiene copolymer, styrene-isobutylene copolymer). The copolymer may be any of a random copolymer a block copolymer and a graft copolymer. The thickness of the adhesive layer is preferably in the range of 0.01 to 10 μm, and more preferably in the range of 0.05 to 5 μm.

A strippable layer may also be provided on the light-sensitive material. The strippable layer is not adhesive at room temperature so that it is easily removed from a support. The layer is usually is adhesive at an elevated temperature. The strippable layer contains an organic polymer (e.g., polyvinyl acetal, polyamide) as matrix of the layer. The flow softening point of the matrix polymer is preferably higher than the temperature of the heat development.

The strippable layer preferably contains a fluorine compound in an amount of not less than 1 wt. %. A fluorine surface active agent is preferably used. The thickness of the strippable layer is preferably not less than 1.0 μm, and more preferably not less than 1.4 μm.

EXAMPLE 1

A light-sensitive material was prepared by forming the following layers on a polyethylene terephthalate film (support).

Formation of strippable layer

The following coating solution was coated and dried on a biaxially stretched polyethylene terephthalate film having the thickness of 100 μm to form a strippable layer having the thickness of 1.5 μm.

| Coating solution of strippable layer | Amount |
|---|---|
| Polyvinyl butyral (Denka Butyral 5000-A, Denki Kagaku Kogyo K. K.) | 3.75 g |
| Fluorine surface active agent (Megafac F177P, Dai Nippon Printing Co., Ltd.) | 0.07 g |
| Methanol | 37.50 g |
| n-Propanol | 37.50 g |

Preparation of pigment dispersion

The following composition was dispersed at 2,000 rpm for 2 hours using a Dynomill to obtain a pigment dispersion having the average particle size of 0.2 μm.

| Pigment dispersion | Amount |
|---|---|
| Pigment (Chromofutal Red A2B) | 30 g |
| Allyl methacrylate-methacrylic acid copolymer (binder, copolymerization ratio = 83/17) | 50 g |
| Cyclohexanone (solvent) | 30 g |
| Propylene glycol monomethyl ether (solvent) | 320 g |

Formation of polymerizable layer

The following coating solution was coated and dried on the strippable layer to form a polymerizable layer having the dry thickness of 1.3 μm.

| Coating solution of polymerizable layer | Amount |
|---|---|
| Dipentaerythritol hexaacrylate | 5.0 g |
| Allyl methacrylate-methacrylic acid copolymer (copolymerization ratio = 80/20) | 10.0 g |
| Pigment dispersion | 40.0 g |
| Reducing agent (shown below) | 1.0 g |
| Methyl ethyl ketone | 30.0 g |

(Reducing agent)

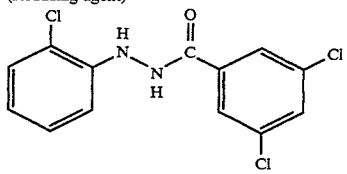

Preparation of silver halide emulsion

Gelatin, potassium bromide and water were placed in a vessel and kept at 55° C. An appropriate amount of ammonium was added to the vessel. Further, an aqueous solution of silver nitrate and an aqueous solution of potassium bromide containing hexachloroiridate (III) (the molar ratio of iridium to silver is $10^{-7}$ mole) were added to the vessel according to a double jet method while keeping the pAg of 7.60 in the reaction vessel to prepare a monodispersed silver bromide emulsion having the average grain size of 0.3 μm. In the emulsion, 98% of the silver halide grains are within the range of ±40% of the average grain size. The emulsion was desalted, and adjusted to pH 6.2 and pAg 8.7. The emulsion was then subjected to gold and sulfur sensitization using sodium thiosulfate and chloroauric acid. Further, 200 ml of methanol solution of the following sensitizing dye (concentration: 2.0M per liter) was added to 1 kg of the emulsion. The mixture was stirred for 15 minutes at 60° C. to prepare a silver halide emulsion.

(Sensitizing dye)

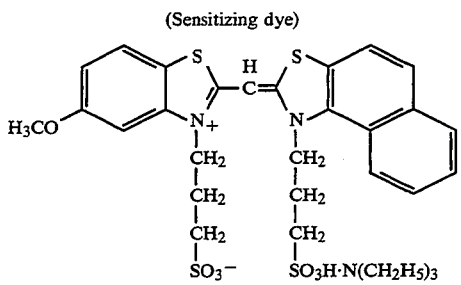

Formation of light-sensitive layer

The following coating solution was coated and dried on the polymerizable layer to form a light-sensitive layer having the dry thickness of about 4.0 μm.

| Coating solution of light-sensitive layer | Amount |
|---|---|
| 10 Wt. % aqueous solution of polyvinyl alcohol (PVA-205, Kuraray Co., Ltd., saponification degree: 88%) | 13.2 g |
| 0.13 Wt. % methanol solution of the following additive (1) | 0.54 g |
| 0.22 Wt. % methanol solution of the following additive (2) | 0.54 g |
| Silver halide emulsion | 0.37 g |
| Light absorbing agent (shown below) | 60 mg |

| 5 Wt. % aqueous solution of the following surface active agent | 1.8 g |

| Coating solution of light-sensitive layer | Amount |
|---|---|
| Water | 1.9 g |

(Additive (1))

(Additive (2))

(Light absorbing agent)

(Surface active agent)

Preparation of base precursor dispersion

In 750 g of 3wt. % aqueous solution of polyvinyl alcohol was dispersed 250 g of powder of the following base precursor using Dynomill dispersing device. The particle size of the base precursor was about not more than 0.5 μm.

(Base precursor)

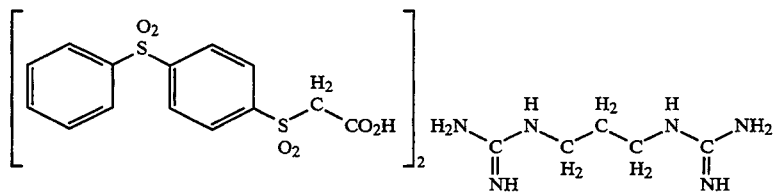

Formation of overcoating layer

The following coating solution was coated and dried on the light-sensitive layer to form an overcoating layer having the dry thickness of about 3.3 μm.

| Coating solution of light-sensitive layer | Amount |
|---|---|
| 10 Wt. % aqueous solution of polyvinyl alcohol (PVA-205, Kuraray Co., Ltd., saponification degree: 98.5%) | 200.0 g |
| Base precursor dispersion | 1.25 g |
| 5 Wt. % aqueous solution of the surface active agent shown above | 4.0 g |

Image formation

An image was formed using the above-prepared light-sensitive material according to the first embodiment of the present invention.

The light-sensitive material was imagewise exposed to light of 488 nm by a scanning exposure (light source: air cooling argon ion laser). The surface exposure was 3 $\mu J/cm^2$. A Nylon mesh (NXX25, NBC industry Co., Ltd.) having thickness of 70 $\mu m$ was placed on the surface of the overcoating layer. Further, a polyethylene terephthalate film having thickness of 75 $\mu m$ was placed on the Nylon mesh. The light-sensitive material was heated for 40 seconds from the support on a hot plate at 140° C. Thus silver halide was developed, and the polymerizable layer was hardened. The light-sensitive material was washed with water to remove the light-sensitive layer and the overcoating layer. The polymerizable layer was immersed for 30 seconds in an alkaline solution, which was prepared by diluting DN-3C (Fuji Photo Film Co., Ltd.) three times with water. The light-sensitive material was washed with water and dried at room temperature to prepare a sample having a hardened image on the strippable layer.

COMPARISON EXAMPLE 1

The light-sensitive material prepared in the Example 1 was imagewise exposed to light using argon ion laser in the same manner as in Example 1. The light-sensitive material was developed in the same manner as in Example 1, except that the Nylon mesh was not used. The material was further treated in the same manner as in Example 1 to prepare a sample having a hardened image on the strippable layer.

COMPARISON EXAMPLE 2

The light-sensitive material prepared in the Example 1 was imagewise exposed to light using argon ion laser in the same manner as in Example 1. The light-sensitive material was developed in the same manner as in Example 1, except that the Nylon mesh and the polyethylene terephthalate film were not used. The material was further treated in the same manner as in Example 1 to prepare a sample having a hardened image on the strippable layer.

Evaluation of hardened image

The fog in the obtained image and the hardness of the image were evaluated.

In the sample of the Example 1, no fog was observed. Further, the mechanical strength of the image was sufficient. Furthermore, the polyethylene terephthalate film was not contaminated. Accordingly, the film could be repeatedly used. Moreover, the Nylon mesh was scarcely contaminated because the mesh was not fully in contact with the surface layer. The mesh could be used repeatedly more than 100 times.

In the sample of the Comparison Example 1, a fog was partially observed within the unexposed (unhardened) area. Further, the polyethylene terephthalate film was contaminated with broken pieces of the overcoating layer. Accordingly, the film was reused only a few times.

With respect to the Comparison Example 2, the hardness of the image was insufficient.

EXAMPLE 2

An image was formed using a light-sensitive material according to the second embodiment of the invention.

The light-sensitive material prepared in the Example 1 was imagewise exposed to light using argon ion laser in the same manner as in Example 1. The Nylon mesh and the polyethylene terephthalate film were placed on the light-sensitive material in the same manner as in Example 1. The light-sensitive material was heated for 40 seconds from the film on a hot plate at 140° C. The material was further treated in the same manner as in Example 1 to prepare a sample having a hardened image on the strippable layer.

In the obtained sample, no fog was observed. Further, the mechanical strength of the image was sufficient. Furthermore, the polyethylene terephthalate film was not contaminated. Accordingly, the film could be repeatedly used. Moreover, the Nylon mesh was scarcely contaminated because the mesh was not fully in contact with the surface layer. The mesh could be used repeatedly more than 100 times.

EXAMPLE 3

An image was formed using a light-sensitive material according to the third embodiment of the invention.

The light-sensitive material prepared in the Example 1 was imagewise exposed to light using argon ion laser in the same manner as in Example 1. The Nylon mesh was placed on the light-sensitive material in the same manner as in Example 1. The light-sensitive material was heated for 40 seconds from the mesh on a ceramic heater at 140° C. The material was further treated in the same manner as in Example 1 to prepare a sample having a hardened image on the strippable layer.

In the obtained sample, no fog was observed. Further, the mechanical strength of the image was sufficient. Furthermore, the ceramic heater was not contaminated. Accordingly, the heater could be repeatedly used.

EXAMPLE 4

A light-sensitive material was prepared by forming the following layers on the aluminum support.

Preparation of aluminum support

A surface of an aluminum sheet having thickness of 0.30 mm was ground using a nylon brush and an aqueous suspension of pumice stone of 400-in mesh, and then sufficiently washed out with water. The aluminum sheet was then immersed for etching in 10% aqueous solution of sodium hydroxide at 70° C. for 60 seconds. Thereafter, the sheet was washed out with running water, then neutralized with 20% aqueous solution of nitric acid and washed out with water. The aluminum sheet was subjected to an electrolytic surface-roughening treatment in 1% aqueous solution of nitric acid in an anodically electric amount of 160 coulomb/$dm^2$ using sine wave alternating-corrugated current under such conditions as an anodic voltage of 12.7 V and a cathodically electric amount ratio to an anodically electric amount of 0.8. The center line average height (Ra) of the aluminum sheet was 0.6 $\mu m$. Subsequently, the aluminum sheet was immersed in 30% aqueous solution of sulfuric acid at 55° C. for 2 minutes to remove smuts, and then subjected to anodizing in 20% aqueous solution of sulfuric acid at a current density of 2 A/$dm^2$ to give an anodized layer having a thickness of 2.7 g/$dm^2$.

Formation of polymerizable layer

The following coating solution was coated and dried on the aluminum support to form a polymerizable layer having a dry thickness of about 1.3 $\mu m$.

| Coating solution of polymerizable layer | Amount |
| --- | --- |
| Dipentaerythritol hexaacrylate | 2.5 g |
| 20 Weight % propylene glycol monomethyl ether solution of allyl methacrylate-methacrylic acid copolymer (copolymerization ratio = 83/17) | 37.5 g |
| The reducing agent used in Example 1 | 2.0 g |
| The pigment dispersion used in Example 1 | 13.0 g |
| Methyl ethyl ketone | 74.0 g |

Preparation of silver halide emulsion

Gelatin, potassium bromide and water were placed in a vessel and kept at 55° C. An appropriate amount of ammonium was added to the vessel. Further, an aqueous solution of silver nitrate and an aqueous solution of potassium bromide containing hexachloroiridate (III) (the molar ratio of iridium to silver is $10^{-7}$ mole) were added to the vessel according to a double jet method while keeping the pAg of 7.60 in the reaction vessel to prepare a monodispersed silver bromide emulsion having the average grain size of 0.3 μm. The emulsion was adjusted to pH 6.2 and pAg 8.7. The emulsion was then subjected to gold and sulfur sensitization using sodium thiosulfate and chloroauric acid. Further, the sensitizing dye used in Example 1 was added to the emulsion. The emulsion was kept for 20 minutes at 55° C. Further, an unsensitized silver iodide emulsion having average particle size of 0.08 μm was added to the emulsion. The mixture was stirred for 15 minutes, desalted and cooled. The silver iodide content of the prepared emulsion was 2 mole %. In the emulsion, 98% of the silver halide grains are within the range of ±40% of the average grain size. The ratio of (100) plane per (111) planes was about 10.

Preparation of light-sensitive layer

The following coating solution was coated over the polymerizable layer to form a light-sensitive layer having dry thickness of about 1.2 μm.

| Coating solution of light-sensitive layer | Amount |
| --- | --- |
| 10 Weight % aqueous solution of polyvinyl alcohol (PVA-420, Kuraray Co., Ltd., saponification degree: 79.5%) | 42.0 g |
| 0.11 Weight % methanol solution of the following additive (3) | 0.83 g |
| Silver halide emulsion | 0.5 g |
| 5 Weight % aqueous solution of the surface active agent used in Example 1 | 0.4 g |
| Water | 7.8 g |

(Additive (3))

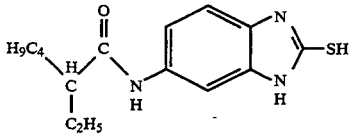

Preparation of base precursor dispersion

In 750 g of 3 wt. % aqueous solution of polyvinyl alcohol was dispersed 250 g of the base precursor powder used in Example 1 using Dynomill dispersing device. The particle size of the base precursor was about not more than 0.5 μm.

Preparation of overcoating layer

The following coating solution was coated over the light-sensitive layer to form an image formation accelerating layer having dry thickness of about 3.3 μm.

| Coating solution of light-sensitive layer | Amount |
| --- | --- |
| 10 Weight % aqueous solution of polyvinyl alcohol (PVA-110, Kuraray Co., Ltd., saponification degree: 98.5%) | 200.0 g |
| The above-prepared base precursor dispersion | 1.25 g |
| 5 Weight % aqueous solution of the surface active agent used in Example 1 | 4.0 g |

Image formation

An image was formed using the above-prepared light-sensitive material according to the first embodiment of the present invention.

The light-sensitive material was imagewise exposed to light of 488 nm by a scanning exposure (light source: air cooling argon ion laser). The surface exposure was 3 μJ/cm². On the surface of the overcoating layer, 5 silicone rubber boards having thickness of 250 μm were placed. Further, an aluminum plate having thickness of 100 μm was placed on the rubber boards. The light-sensitive material was heated for 40 seconds from the support on a hot plate at 145° C. Thus silver halide was developed, and the polymerizable layer was hardened. The light-sensitive material was washed with water to remove the light-sensitive layer and the overcoating layer. The surface of the polymerizable layer was brushed in an alkaline solution (Fuji PS Developing Solution DN-3C, Fuji Photo Film Co., Ltd.) using an automatic etching machine. The light-sensitive material was washed with water to remove the unhardened polymerizable layer to form a hardened image.

COMPARISON EXAMPLE 3

The light-sensitive material prepared in the Example 4 was imagewise exposed to light using argon ion laser in the same manner as in Example 4. The light-sensitive material was developed in the same manner as in Example 1, except that the rubber boards were not used. The material was further treated in the same manner as in Example 4 to form a hardened image.

Evaluation of hardened image

The fog in the obtained image and the hardness of the image were evaluated.

In the sample of the Example 4, no fog was observed. Further, the mechanical strength of the image was sufficient.

In the sample of the Comparison Example 3, a fog was partially observed within the unexposed (unhardened) area. Further, the hardness of the hardened area was partially insufficient.

EXAMPLE 5

Preparation of matting agent dispersion

The following ingredients were dispersed in a homogenizer at 13000 rpm for 5 minutes to prepare a matting agent dispersion having average particle size of 12 μm.

| Matting agent dispersion | Amount |
| --- | --- |
| Silicon oxide particles (matting agent, Mizucasilu P78F, Mizusawa Industrial Chemical Co., Ltd.) | 3 g |
| Polyester resin (binder, Biron 200, Toyobo Co., Ltd.) | 15 g |
| Toluene (solvent) | 30 g |
| Methyl ethyl ketone (solvent) | 30 g |

Formation of cover sheet

The matting agent dispersion was coated and dried on a biaxially stretched polyethylene terephthalate film having thickness of 75 μm to form a rough surface (matting layer) on the film. The dry weight of the matting layer was 1.6 g/m².

Image formation

An image was formed using the light-sensitive material prepared in Example 1 according to the first embodiment of the present invention.

The light-sensitive material was imagewise exposed to light of 488 nm by a scanning exposure (light source: air cooling argon ion laser). The surface exposure was 3 μJ/cm². The surface of the overcoating layer was covered with the rough surface of the sheet. The light-sensitive material was heated from the support on a hot plate at 140° C. Thus silver halide was developed, and the polymerizable layer was hardened. The light-sensitive material was washed with water to remove the light-sensitive layer and the overcoating layer. The polymerizable layer was immersed for 30 seconds in an alkaline solution, which was prepared by diluting DN-3C (Fuji Photo Film Co., Ltd.) three times with water. The light-sensitive material was washed with water and dried at room temperature to prepare a sample having a hardened image on the strippable layer.

COMPARISON EXAMPLE 4

The light-sensitive material prepared in the Example 1 was imagewise exposed to light using argon ion laser in the same manner as in Example 1. The light-sensitive material was developed in the same manner as in Example 1, except that a polyethylene terephthalate film of 75 μm having no rough surface was used as the cover sheet. The material was further treated in the same manner as in Example 5 to prepare a sample having a hardened image on the strippable layer.

COMPARISON EXAMPLE 5

The light-sensitive material prepared in the Example 1 was imagewise exposed to light using argon ion laser in the same manner as in Example 5. The light-sensitive material was developed in the same manner as in Example 5, except that the cover sheet was not used. The material was further treated in the same manner as in Example 5 to prepare a sample having a hardened image on the strippable layer.

Evaluation of hardened image

The fog in the obtained image and the hardness of the image were evaluated.

In the sample of the Example 5, no fog was observed. Further, the mechanical strength of the image was sufficient. Furthermore, the polyethylene terephthalate film was not contaminated. Accordingly, the film could be repeatedly used.

In the sample of the Comparison Example 4, a fog was partially observed within the unexposed (unhardened) area. Further, the polyethylene terephthalate film was contaminated with broken pieces of the overcoating layer. Accordingly, the film was reused only a few times.

With respect to the Comparison Example 5, the hardness of the image was insufficient.

EXAMPLE 6

An image was formed using a light-sensitive material according to the second embodiment of the invention.

The light-sensitive material prepared in the Example 1 was imagewise exposed to light using argon ion laser in the same manner as in Example 5. The cover sheet was placed on the light-sensitive material in the same manner as in Example 5. The light-sensitive material was heated for 40 seconds from the cover sheet on a hot plate at 140° C. The material was further treated in the same manner as in Example 5 to prepare a sample having a hardened image on the strippable layer.

In the obtained sample, no fog was observed. Further, the mechanical strength of the image was sufficient. Furthermore, the polyethylene terephthalate film was not contaminated. Accordingly, the film could be repeatedly used.

EXAMPLE 7

Formation of rough surface on heater

Steel balls having diameter of 70 μm were dispersed in water. The dispersion was perpendicularly jetted to a stainless surface of a heater at distance of 30 cm. Thus a rough surface (maximum depth: 20 μm) was formed on the stainless heater.

An image was formed using a light-sensitive material according to the third embodiment of the invention.

The light-sensitive material prepared in the Example 1 was imagewise exposed to light using argon ion laser in the same manner as in Example 5. The surface of the overcoating layer was covered with the rough surface of the stainless heater. The light-sensitive material was heated for 40 seconds by the stainless heater at 140° C. The material was further treated in the same manner as in Example 5 to prepare a sample having a hardened image on the strippable layer.

In the obtained sample, no fog was observed. Further, the mechanical strength of the image was sufficient. Furthermore, the stainless heater was not contaminated. Accordingly, the heater could be repeatedly used.

EXAMPLE 8

Preparation of matting agent dispersion

The following ingredients were dispersed in a homogenizer at 13000 rpm for 5 minutes to prepare a matting agent dispersion having average particle size of 3 μm.

| Matting agent dispersion | Amount |
|---|---|
| Silicon resin particles (matting agent, Tospearl 130, Toshiba Silicon Co., Ltd.) | 3 g |
| Polyester resin (binder, Biron 200, Toyobo Co., Ltd.) | 15 g |
| Toluene (solvent) | 30 g |
| Methyl ethyl ketone (solvent) | 30 g |

Formation of cover sheet

The matting agent dispersion was coated and dried on a polycarbonate film having thickness of 150 μm to form a rough surface (matting layer) on the film. The dry weight of the matting layer was 1.0 g/m².

Image formation

An image was formed using the light-sensitive material used in Example 4 according to the first embodiment of the present invention.

The light-sensitive material was imagewise exposed to light of 488 nm by a scanning exposure (light source: air cooling argon ion laser). The surface exposure was 3 μJ/cm². The surface of the overcoating layer was covered with the rough surface of the sheet. The light-sensitive material was heated for 40 seconds from the support on a hot plate at 145° C. Thus silver halide was developed, and the polymerizable layer was hardened. The light-sensitive material was washed with water to remove the light-sensitive layer and the overcoating layer. The surface of the polymerizable layer was brushed in an alkaline solution (Fuji PS Developing Solution DN-3C, Fuji Photo Film Co., Ltd.) using an automatic etching machine. The light-sensitive material was washed with water to remove the unhardened polymerizable layer to form a hardened image.

COMPARISON EXAMPLE 6

The light-sensitive material prepared in the Example 4 was imagewise exposed to light using argon ion laser in the same manner as in Example 8. The light-sensitive material was developed in the same manner as in Example 8, except that a polycarbonate film of 150 $\mu$m having no rough surface was used as the cover sheet. The material was further treated in the same manner as in Example 8 to form a hardened image.

Evaluation of hardened image

The fog in the obtained image and the hardness of the image were evaluated.

In the sample of the Example 8, no fog was observed. Further, the mechanical strength of the image was sufficient. Furthermore, the polycarbonate film was not contaminated. Accordingly, the film could be repeatedly used.

In the sample of the Comparison Example 6, a fog was partially observed within the unexposed (unhardened) area. Further, the hardness of the hardened area was partially insufficient. Furthermore, the polycarbonate film was contaminated with broken pieces of the overcoating layer. Accordingly, the film was reused only a few times.

EXAMPLE 9

Formation of cover sheet

On a biaxially stretched polyethylene terephthalate film having thickness of 75 $\mu$m, a gravure printing was conducted using the following ink and a dot screen of 80 mesh (printing ratio: 20%) to form a rough surface (height of projection: about 4 $\mu$m) on the film.

| Composition of ink | Amount |
| --- | --- |
| Polyester resin (binder, Biron 200, Toyobo Co., Ltd.) | 15 g |
| Toluene (solvent) | 30 g |
| Methyl ethyl ketone (solvent) | 30 g |

An image was formed according to the first embodiment of the present invention in the same manner as in Example 8, except that the above-prepared cover sheet was used.

In the obtained sample, no fog was observed. Further, the mechanical strength of the image was sufficient. Furthermore, the polyethylene terephthalate film was not contaminated. Accordingly, the film could be repeatedly used.

EXAMPLE 10

Formation of cover sheet

Sand particles were jet to a biaxially stretched polyethylene terephthalate film having thickness of 75 $\mu$m according to a sand blast method to form a rough surface (average depth: 15 $\mu$m) on the film.

An image was formed according to the first embodiment of the present invention in the same manner as in Example 8, except that the above-prepared cover sheet was used.

In the obtained sample, no fog was observed. Further, the mechanical strength of the image was sufficient. Furthermore, the polyethylene terephthalate film was not contaminated. Accordingly, the film could be repeatedly used.

We claim:

1. An image forming method comprising the steps of:
   imagewise exposing to light a light-sensitive material which comprises a support and a light-sensitive polymerizable layer containing silver halide, a reducing agent and an ethylenically unsaturated polymerizable compound or a cross-linkable polymer, any of said silver halide, said reducing agent, said polymerizable compound and said polymer not being encapsulated in the layer; and
   simultaneously or thereafter heating the light-sensitive material at a temperature of not lower than 70° C. to develop the silver halide and harden the ethylenically unsaturated polymerizable compound or the cross-linkable polymer, whereby a hardened image is formed on the light-sensitive material,
   wherein the heat development is conducted by heating the light-sensitive material from side of the support under conditions that a surface of the light-sensitive polymerizable layer is covered with a cover sheet and that a space of 0.5 to 500 $\mu$m intervenes between the light-sensitive polymerizable layer and the sheet, wherein the space is formed by placing pieces of solid substances between the layer and the sheet.

2. The image forming method as claimed in claim 1, wherein the light-sensitive polymerizable layer further contains a base precursor.

3. The image forming method as claimed in claim 1, wherein the light-sensitive polymerizable layer comprises a light-sensitive layer containing the silver halide and a polymerizable layer containing the ethylenically unsaturated polymerizable compound or the cross-linkable polymer.

4. An image forming method comprising the steps of:
   imagewise exposing to light a light-sensitive material which comprises a support and a light-sensitive polymerizable layer containing silver halide, a reducing agent and an ethylenically unsaturated polymerizable compound or a cross-linkable polymer, any of said silver halide, said reducing agent, said polymerizable compound and said polymer not being encapsulated in the layer; and
   simultaneously or thereafter heating the light-sensitive material at a temperature of not lower than 70° C. to develop the silver halide and harden the ethylenically unsaturated polymerizable compound or the cross-linkable polymer, whereby a hardened image is formed on the light-sensitive material,
   wherein the heat development is conducted by heating the light-sensitive material from side of the layer under conditions that a surface of the light-sensitive polymerizable layer is covered with a cover sheet and that a space of 0.5 to 500 $\mu$m intervenes between the light-sensitive polymerizable layer and the sheet, wherein the space is formed by placing pieces of solid substance between the layer and the sheet.

5. The image forming method as claimed in claim 4, wherein the light-sensitive polymerizable layer further contains a base precursor.

6. The image forming method as claimed in claim 4, wherein the light-sensitive polymerizable layer comprises a light-sensitive layer containing the silver halide and a polymerizable layer containing the ethylenically unsaturated polymerizable compound or the cross-linkable polymer.

7. An image forming method comprising the steps of:
imagewise exposing to light a light-sensitive material which comprises a support and a light-sensitive polymerizable layer containing silver halide, a reducing agent and an ethylenically unsaturated polymerizable compound or a cross-linkable polymer, any of said silver halide, said reducing agent, said polymerizable compound and said polymer not being encapsulated in the layer; and
simultaneously or thereafter heating the light-sensitive material at a temperature of not lower than 70° C. to develop the silver halide and harden the ethylenically unsaturated polymerizable compound or the cross-linkable polymer, whereby a hardened image is formed on the light-sensitive material,
wherein the heat development is conducted by heating the light-sensitive material from side of the layer under conditions that a surface of the light-sensitive polymerizable layer is covered with a heating means and that a space of 0.5 to 500 μm intervenes between the light-sensitive polymerizable layer and the heating means, wherein the space is formed by placing pieces of solid substance between the layer and the heating means.

8. The image forming method as claimed in claim 7, wherein the light-sensitive polymerizable layer further contains a base precursor.

9. The image forming method as claimed in claim 7, wherein the light-sensitive polymerizable layer comprises a light-sensitive layer containing the silver halide and a polymerizable layer containing the ethylenically unsaturated polymerizable compound or the cross-linkable polymer.

10. An image forming method comprising the steps of:
imagewise exposing to light a light-sensitive material which comprises a support and a light-sensitive polymerizable layer containing silver halide, a reducing agent and an ethylenically unsaturated polymerizable compound or a cross-linkable polymer, any of said silver halide, said reducing agent, said polymerizable compound and said polymer not being encapsulated in the layer; and
simultaneously or thereafter heating the light-sensitive material at a temperature of not lower than 70° C. to develop the silver halide and harden the ethylenically unsaturated polymerizable compound or the cross-linkable polymer, whereby a hardened image is formed on the light-sensitive material,
wherein the heat development is conducted by heating the light-sensitive material from side of the support under conditions that a surface of the light-sensitive polymerizable layer is covered with a cover sheet and that a space of 0.5 to 500 μm intervenes between the light-sensitive polymerizable layer and the sheet, wherein the space is formed by placing a net between the layer and the sheet.

11. The image forming method as claimed in claim 10, wherein the light-sensitive polymerizable layer further contains a base precursor.

12. The image forming method as claimed in claim 10, wherein the light-sensitive polymerizable layer comprises a light-sensitive layer containing the silver halide and a polymerizable layer containing the ethylenically unsaturated polymerizable compound or the cross-linkable polymer.

13. An image forming method comprising the steps of:
imagewise exposing to light a light-sensitive material which comprises a support and a light-sensitive polymerizable layer containing silver halide, a reducing agent and an ethylenically unsaturated polymerizable compound or a cross-linkable polymer, any of said silver halide, said reducing agent, said polymerizable compound and said polymer not being encapsulated in the layer; and
simultaneously or thereafter heating the light-sensitive material at a temperature of not lower than 70° C. to develop the silver halide and harden the ethylenically unsaturated polymerizable compound or the cross-linkable polymer, whereby a hardened image is formed on the light-sensitive material,
wherein the heat development is conducted by heating the light-sensitive material from side of the support under conditions that a surface of the light-sensitive polymerizable layer is covered with a cover sheet and that a space of 0.5 to 500 μm intervenes between the light-sensitive polymerizable layer and the sheet, wherein the sheet has a rough surface and the space is formed by the rough surface of the sheet.

14. The image forming method as claimed in claim 13, wherein the light-sensitive polymerizable layer further contains a base precursor.

15. The image forming method as claimed in claim 13, wherein the light-sensitive polymerizable layer comprises a light-sensitive layer containing the silver halide and a polymerizable layer containing the ethylenically unsaturated polymerizable compound or the cross-linkable polymer.

16. An image forming method comprising the steps of:
imagewise exposing to light a light-sensitive material which comprises a support and a light-sensitive polymerizable layer containing silver halide, a reducing agent and an ethylenically unsaturated polymerizable compound or a cross-linkable polymer, any of said silver halide, said reducing agent, said polymerizable compound and said polymer not being encapsulated in the layer; and
simultaneously or thereafter heating the light-sensitive material at a temperature of not lower than 70° C. to develop the silver halide and harden the ethylenically unsaturated polymerizable compound or the cross-linkable polymer, whereby a hardened image is formed on the light-sensitive material,
wherein the heat development is conducted by heating the light-sensitive material from side of the layer under conditions that a surface of the light-sensitive polymerizable layer is covered with a cover sheet and that a space of 0.5 to 500 μm intervenes between the light-sensitive polymerizable layer and the sheet, wherein the space is formed by placing a net between the layer and the sheet.

17. The image forming method as claimed in claim 16, wherein the light-sensitive polymerizable layer further contains a base precursor.

18. The image forming method as claimed in claim 16, wherein the light-sensitive polymerizable layer comprises a light-sensitive layer containing the silver halide and a polymerizable layer containing the ethylenically unsaturated polymerizable compound or the cross-linkable polymer.

19. An image forming method comprising the steps of:

imagewise exposing to light a light-sensitive material which comprises a support and a light-sensitive polymerizable layer containing silver halide, a reducing agent and an ethylenically unsaturated polymerizable compound or a cross-linkable polymer, any of said silver halide, said reducing agent, said polymerizable compound and said polymer not being encapsulated in the layer; and simultaneously or thereafter heating the light-sensitive material at a temperature of not lower than 70° C. to develop the silver halide and harden the ethylenically unsaturated polymerizable compound or the cross-linkable polymer, whereby a hardened image is formed on the light-sensitive material, wherein the heat development is conducted by heating the light-sensitive material from side of the layer under conditions that a surface of the light-sensitive polymerizable layer is covered with a cover sheet and that a space of 0.5 to 500 $\mu$m intervenes between the light-sensitive polymerizable layer and the sheet, wherein the sheet has a rough surface and the space is formed by the rough surface of the sheet.

20. The image forming method as claimed in claim 19, wherein the light-sensitive polymerizable layer further contains a base precursor.

21. The image forming method as claimed in claim 19, wherein the light-sensitive polymerizable layer comprises a light-sensitive layer containing the silver halide and a polymerizable layer containing the ethylenically unsaturated polymerizable compound or the cross-linkable polymer.

22. An image forming method comprising the steps of:

imagewise exposing to light a light-sensitive material which comprises a support and a light-sensitive polymerizable layer containing silver halide, a reducing agent and an ethylenically unsaturated polymerizable compound or a cross-linkable polymer, any of said silver halide, said reducing agent, said polymerizable compound and said polymer not being encapsulated in the layer; and simultaneously or thereafter heating the light-sensitive material at a temperature of not lower than 70° C. to develop the silver halide and harden the ethylenically unsaturated polymerizable compound or the cross-linkable polymer, whereby a hardened image is formed on the light-sensitive material, wherein the heat development is conducted by heating the light-sensitive material from side of the layer under conditions that a surface of the light-sensitive polymerizable layer is covered with a heating means and that a space of 0.5 to 500 $\mu$m intervenes between the light-sensitive polymerizable layer and the heating means, wherein the space is formed by placing a net between the layer and the heating means.

23. The image forming method as claimed in claim 22, wherein the light-sensitive polymerizable layer further contains a base precursor.

24. The image forming method as claimed in claim 22, wherein the light-sensitive polymerizable layer comprises a light-sensitive layer containing the silver halide and a polymerizable layer containing the ethylenically unsaturated polymerizable compound or the cross-linkable polymer.

25. An image forming method comprising the steps of:

imagewise exposing to light a light-sensitive material which comprises a support and a light-sensitive polymerizable layer containing silver halide, a reducing agent and an ethylenically unsaturated polymerizable compound or a cross-linkable polymer, any of said silver halide, said reducing agent, said polymerizable compound and said polymer not being encapsulated in the layer; and simultaneously or thereafter heating the light-sensitive material at a temperature of not lower than 70° C. to develop the silver halide and harden the ethylenically unsaturated polymerizable compound or the cross-linkable polymer, whereby a hardened image is formed on the light-sensitive material, wherein the heat development is conducted by heating the light-sensitive material from side of the layer under conditions that a surface of the light-sensitive polymerizable layer is covered with a heating means and that a space of 0.5 to 500 $\mu$m intervenes between the light-sensitive polymerizable layer and the heating means, wherein the heating means has a rough surface and the space is formed by the rough surface of the heating means.

26. The image forming method as claimed in claim 25, wherein the light-sensitive polymerizable layer further contains a base precursor.

27. The image forming method as claimed in claim 25, wherein the light-sensitive polymerizable layer comprises a light-sensitive layer containing the silver halide and a polymerizable layer containing the ethylenically unsaturated polymerizable compound or the cross-linkable polymer.

* * * * *